US009560739B2

(12) United States Patent
Nishida et al.

(10) Patent No.: US 9,560,739 B2
(45) Date of Patent: Jan. 31, 2017

(54) WIRING BOARD

(71) Applicant: NGK SPARK PLUG CO., LTD., Nagoya-shi, Aichi (JP)

(72) Inventors: Tomohiro Nishida, Mizuho (JP); Seiji Mori, Konan (JP); Makoto Wakazono, Niwa-gun (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 32 days.

(21) Appl. No.: 14/376,744

(22) PCT Filed: Apr. 10, 2013

(86) PCT No.: PCT/JP2013/002423
§ 371 (c)(1),
(2) Date: Aug. 5, 2014

(87) PCT Pub. No.: WO2013/171964
PCT Pub. Date: Nov. 21, 2013

(65) Prior Publication Data
US 2015/0027750 A1 Jan. 29, 2015

(30) Foreign Application Priority Data
May 16, 2012 (JP) .................................. 2012-112015

(51) Int. Cl.
H05K 1/02 (2006.01)
H05K 3/34 (2006.01)
(Continued)

(52) U.S. Cl.
CPC ....... *H05K 1/0213* (2013.01); *H01L 23/49811* (2013.01); *H05K 3/3452* (2013.01);
(Continued)

(58) Field of Classification Search
CPC ...................... H05K 3/4061; H01L 23/49861
(Continued)

(56) References Cited

U.S. PATENT DOCUMENTS 6,228,466 B1 5/2001 Tsukada et al.
6,469,394 B1 10/2002 Wong et al.
(Continued)

FOREIGN PATENT DOCUMENTS

JP 7-202395 A 8/1995
JP 11-54896 A 2/1999
(Continued)

OTHER PUBLICATIONS

JPO/ISA, International Search Report in corresponding international application No. PCT/JP2013/002423 mailed Jun. 4, 2013.
(Continued)

*Primary Examiner* — Chau N Nguyen
(74) *Attorney, Agent, or Firm* — Stites & Harbison, PLLC; Jeffrey A. Haeberlin; James R. Hayne

(57) ABSTRACT

To provide a wiring substrate which can prevent short circuit between connection terminals, and which realizes reduction of the pitch between the connection terminals. The wiring substrate of the present invention includes a layered structure including one or more insulation layers and one or more conductor layers, and the wiring substrate is characterized in that a plurality of connection terminals are formed on the layered structure so as to be separated from one another; a filling member is filled between the connection terminals; and each of the connection terminals has a side surface composed of a contact surface which is in contact with the filling member, and a spaced surface which is not in contact with the filling member and which is located above the contact surface and below the top surface of the filling member.

15 Claims, 17 Drawing Sheets

(51) Int. Cl.
  *H05K 3/28* (2006.01)
  *H01L 23/498* (2006.01)
  *H05K 3/24* (2006.01)
  *H05K 1/11* (2006.01)

(52) U.S. Cl.
  CPC .. *H01L 23/49816* (2013.01); *H01L 23/49822* (2013.01); *H01L 23/49827* (2013.01); *H01L 2924/0002* (2013.01); *H05K 1/111* (2013.01); *H05K 3/244* (2013.01); *H05K 3/28* (2013.01); *H05K 2201/099* (2013.01); *H05K 2201/09881* (2013.01); *H05K 2203/0571* (2013.01); *H05K 2203/0588* (2013.01)

(58) Field of Classification Search
  USPC .................................................. 174/265, 267
  See application file for complete search history.

(56) References Cited

U.S. PATENT DOCUMENTS

| | | | |
|---|---|---|---|
| 6,809,415 B2* | 10/2004 | Tsukada | H05K 3/3452 174/257 |
| 2003/0218250 A1 | 11/2003 | Kung et al. | |
| 2008/0251279 A1 | 10/2008 | Muramatsu et al. | |
| 2008/0272501 A1 | 11/2008 | Hu | |
| 2009/0144972 A1 | 6/2009 | Cheng et al. | |
| 2009/0218122 A1 | 9/2009 | Fukase | |
| 2009/0233436 A1* | 9/2009 | Kim | H01L 24/11 438/614 |
| 2010/0155116 A1 | 6/2010 | Kawai et al. | |
| 2011/0253422 A1 | 10/2011 | Muramatsu et al. | |
| 2012/0006592 A1* | 1/2012 | Ouchi | H01L 23/49816 174/267 |
| 2012/0025365 A1* | 2/2012 | Haba | H01L 21/4853 257/692 |
| 2012/0124830 A1 | 5/2012 | Cheng et al. | |

FOREIGN PATENT DOCUMENTS

| | | |
|---|---|---|
| JP | 2004-214700 A | 7/2004 |
| JP | 2007-149998 A | 6/2007 |
| JP | 2008-140886 A | 6/2008 |
| JP | 2009-212228 A | 9/2009 |
| JP | 2013-55208 A | 3/2013 |
| TW | 200926922 A | 6/2009 |

OTHER PUBLICATIONS

European Patent Office, Supplementary European Search Report, issued in corresponding European application No. 13790895, mailed Sep. 9, 2015.

Taiwan Intellectual Property Office, Office Action issued in corresponding Application No. 102116876, mailed Jun. 22, 2016.

\* cited by examiner (a)

(b)

(a)

(b)

(a)

(b)

(a)

(b)

(a)

(b)

WIRING BOARD

TECHNICAL FIELD

The present invention relates to a wiring substrate having, on a main surface thereof, a plurality of terminals for connection to semiconductor chips.

BACKGROUND ART

Generally, a wiring substrate has, on a main surface (front surface) thereof, terminals for connection to semiconductor chips (hereinafter may be referred to as "connection terminals"). In recent years, connection terminals have been provided at high packing density, and the distance (pitch) between adjacent connection terminals has been reduced. Thus, there has been proposed a wiring substrate having an NSMD (non-solder mask defined) structure in which a plurality of connection terminals are arranged in a single opening of a solder resist layer.

However, when a plurality of connection terminals are arranged in a single opening at small pitches, solder applied (through coating) onto the front surface of a connection terminal may flow toward an adjacent connection terminal, and short circuit may occur between these connection terminals. Therefore, there has been proposed a wiring substrate in which an insulating partition wall is provided between adjacent connection terminals so as to prevent flow of solder applied (through coating) on the front surface of a connection terminal toward an adjacent connection terminal (see, for example, Patent Document 1).

PRIOR ART DOCUMENT

Patent Document

Patent Document 1: Japanese Patent Application Laid-Open (kokai) No. 2009-212228

SUMMARY OF THE INVENTION

Problems to be Solved by the Invention

In general, when a connection terminal is coated with solder, the solder assumes a spherical shape (ball shape) by the effect of surface tension. In the case of the wiring substrate disclosed in Patent Document 1, since the top surface and opposite side surfaces of each connection terminal are coated with solder, the solder which covers the connection terminal has a large diameter. Thus, the distance between adjacent connection terminals must be increased; i.e., difficulty is encountered in further reducing the pitch between the connection terminals.

Also, in the wiring substrate disclosed in Patent Document 1, the top surface and opposite side surfaces of each connection terminal are exposed so that the top surface and side surfaces of the connection terminal are coated with solder. That is, only the bottom surface of each connection terminal is bonded to an underlying resin. However, since the pitch between adjacent connection terminals is reduced as described above, the connection terminals are also reduced in size. Thus, in the case of the wiring substrate disclosed in Patent Document 1, in which only the bottom surface of each connection terminal is bonded to the underlying resin, a sufficient bonding strength may fail to be attained, resulting in removal of the connection terminal during the course of production of the wiring substrate.

In view of the foregoing, an object of the present invention is to provide a wiring substrate which does not cause short circuit between connection terminals, and which realizes reduction of the pitch between the connection terminals.

Means for Solving the Problems

In order to achieve the aforementioned object, the present invention provides a wiring substrate comprising a layered structure including one or more insulation layers and one or more conductor layers, the wiring substrate being characterized in that a plurality of connection terminals are formed on the layered structure so as to be separated from one another; a filling member is filled between the connection terminals; and each of the connection terminals has a side surface composed of a contact surface which is in contact with the filling member, and a spaced surface which is not in contact with the filling member and which is located above the contact surface and below the top surface of the filling member.

According to the present invention, each connection terminal has a side surface composed of a contact surface which is in contact with the filling member, and a spaced surface which is not in contact with the filling member and which is located above the contact surface and below the top surface of the filling member. Thus, when the surface of each connection terminal is covered with a metal plating layer, the metal plating layer enters a space provided between the spaced surface of the connection terminal and the filling member. Therefore, there can be avoided a state where the metal plating layer extends over the top surface of the filling member (see FIG. 14); i.e., a state where the distance between metal plating layers formed on the surfaces of adjacent connection terminals is reduced. Thus, there can be prevented short circuit between connection terminals during coating of the connection terminals with solder or during mounting of a semiconductor chip on the connection terminals, which short circuit would otherwise occur due to flow of the solder from each connection terminal toward the adjacent connection terminal.

When each connection terminal is coated with solder, the solder enters a space provided between the spaced surface of the connection terminal and the filling member. Therefore, there can be prevented short circuit between adjacent connection terminals, which would otherwise occur due to flow of solder coating the front surface of each connection terminal toward an adjacent connection terminal.

In addition, the aforementioned metal plating layer or solder, or an underfill material employed for mounting of a semiconductor chip enters the aforementioned space. Since the thus-entered metal plating layer, solder, or underfill material serves as an anchor for the connection terminals, sufficient bonding strength can be attained. Therefore, removal of the connection terminal can be prevented during the course of production of the wiring substrate.

In one mode of the present invention, the contact surface and the spaced surface are formed so as to extend over the entire side surface of each of connection terminal. Therefore, short circuit between adjacent connection terminals, which would otherwise occur due to solder flowing, etc., can be prevented at the entire side surface of each connection terminal.

In another mode of the present invention, a space provided between the spaced surface and the filling member preferably has a depth of 6 μm or less.

In yet another mode of the present invention, the space provided between the spaced surface and the filling member preferably has a width of 6 μm or less.

In still another mode of the present invention, the filling member serves as a solder resist. Since the filling member serves as a solder resist, solder remains on the filling member, and thus occurrence of short circuit between adjacent connection terminals can be prevented.

The layered structure also has thereon a solder resist layer having openings through which the connection terminals are exposed, and covering a wiring pattern connected to the connection terminals. Occurrence of short circuit at the wiring pattern can be prevented by covering the wiring pattern with the solder resist layer (i.e., an insulation member).

Effects of the Invention

As described above, according to the present invention, there can be provided a wiring substrate which can prevent short circuit between connection terminals, and which realizes reduction of the pitch between the connection terminals.

MODES FOR CARRYING OUT THE INVENTION

Embodiments of the present invention will next be described in detail with reference to the drawings. The embodiments of the present invention will be described by taking, as an example, a wiring substrate including a core substrate and a build-up layer formed on the core substrate. However, no particular limitation is imposed on the wiring substrate, so long as the wiring substrate has a plurality of connection terminals whose top surfaces and side surfaces are exposed. For example, it may be the case that the wiring substrate does not have a core substrate.

First Embodiment

Figure 1:
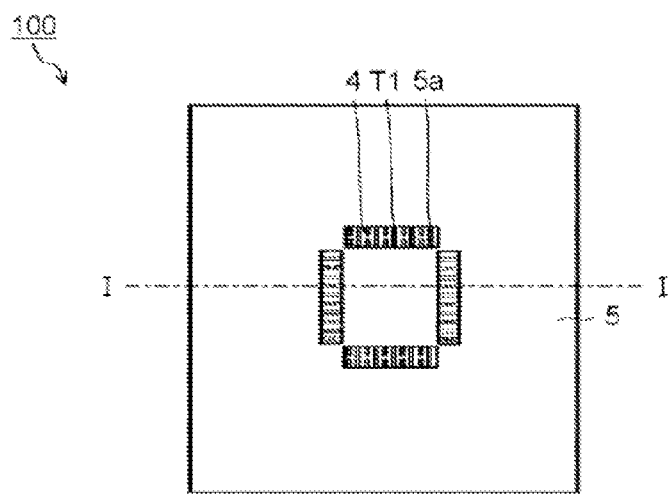
FIG. 1 is a plan view (on the front surface side) of a wiring substrate according to a first embodiment.
Figure 2:
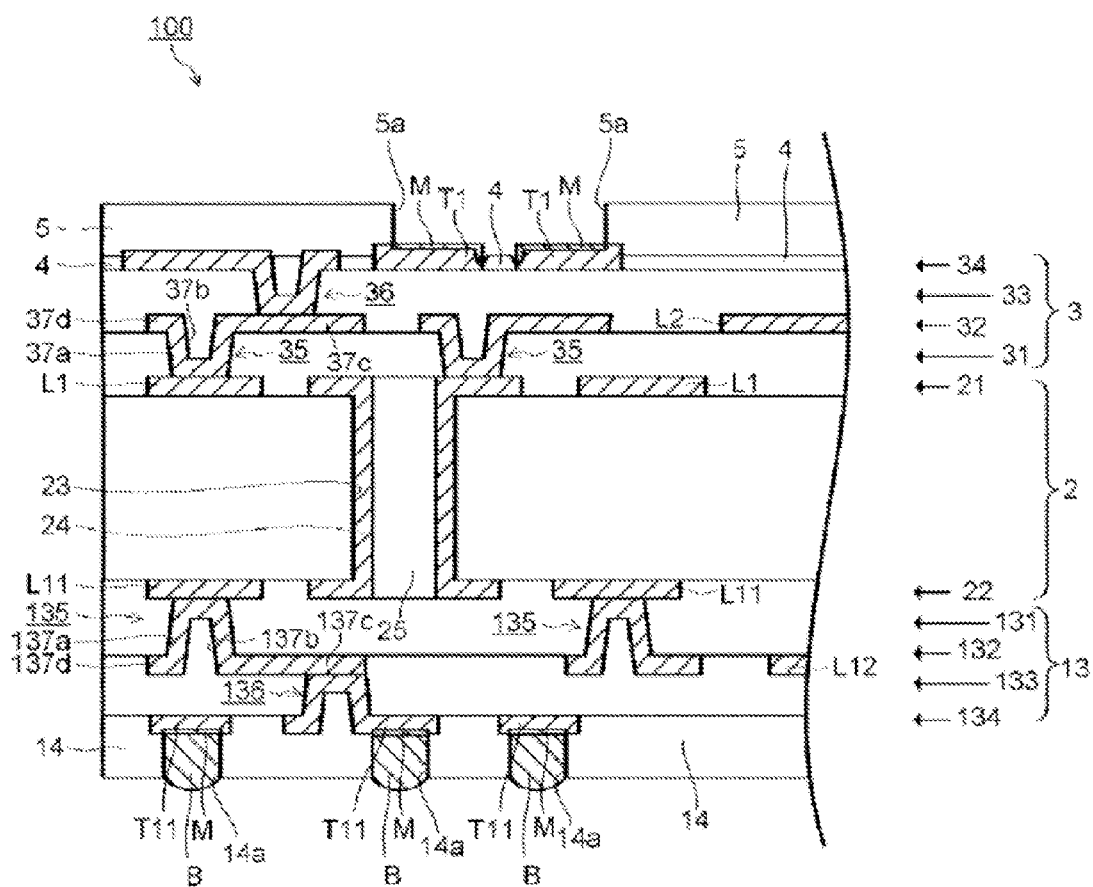
FIG. 2 is a partially cross-sectional view of the wiring substrate according to the first embodiment.
Figure 3:
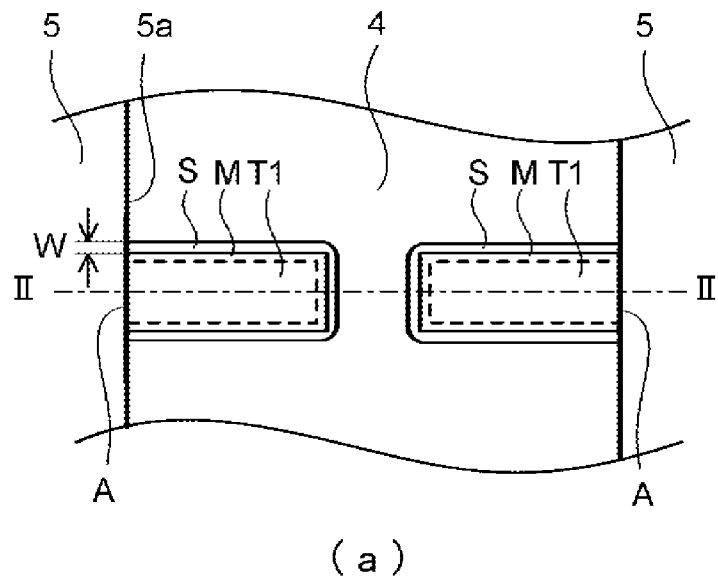
FIG. 3 shows the configuration of connection terminals on the front surface side of the wiring substrate according to the first embodiment.
Figure 3:
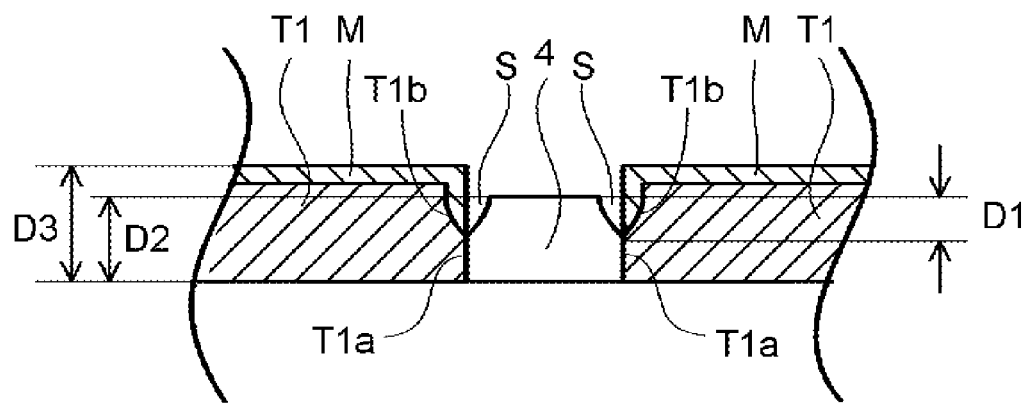

FIG. 1 is a plan view (on the front surface side) of a wiring substrate 100 according to the first embodiment. FIG. 2 is a partially cross-sectional view of the wiring substrate 100 taken along line I-I of FIG. 1. FIG. 3 shows the configuration of connection terminals T1 formed on the front surface side of the wiring substrate 100. FIG. 3(a) is a top view of the connection terminals T1. FIG. 3(b) is a cross-sectional view taken along line II-II of FIG. 3(a). In the following description, the side on which semiconductor chips are connected is referred to as the front surface side, and the side on which a motherboard, a socket, or the like (hereinafter referred to as a "motherboard or the like") is connected is referred to as the back surface side.

(Configuration of wiring substrate 100) The wiring substrate 100 shown in FIGS. 1 to 3 includes a core substrate 2; a build-up layer 3 (on the front surface side) on which are formed a plurality of connection terminals T1 for connection to semiconductor chips (not illustrated) and which is stacked on the front surface side of the core substrate 2; a filling member 4 which is stacked on the front surface side of the build-up layer 3 and which is filled between the connection terminals T1; a solder resist layer 5 stacked on the front surface side of the filling member 4 and having openings 5a through which the connection terminals T1 are at least partially exposed; a build-up layer 13 (on the back surface side) on which are formed a plurality of connection terminals T11 for connection to a mother board or the like (not illustrated) and which is stacked on the back surface side of the core substrate 2; and a solder resist layer 14 stacked on the back surface side of the build-up layer 13 and having openings 14a through which the connection terminals T11 are at least partially exposed.

The core substrate 2 is a plate-like resin substrate formed of, for example, a heat-resistant resin plate (e.g., a bismaleimide-triazine resin plate) or a fiber-reinforced resin plate (e.g., a glass-fiber-reinforced epoxy resin). Core conductor layers 21 and 22, which serve as metal wirings L1 and L11, are formed on the front surface and the back surface of the core substrate 2, respectively. The core substrate 2 has through holes 23 provided by means of, for example, a drill. A through hole conductor 24 is formed on the inner wall of each of the through holes 23 for achieving electrical conduction between the core conductor layers 21 and 22. Furthermore, the through holes 23 are filled with a resin filler material 25 such as epoxy resin.

(Configuration on front surface side) The build-up layer 3 is formed of resin insulation layers 31 and 33 and conductor layers 32 and 34 stacked on the front surface side of the core substrate 2. The resin insulation layer 31 is formed of a thermosetting resin composition, and the conductor layer 32, which serves as a metal wiring L2, is formed on the front surface of the resin insulation layer 31. The resin insulation layer 31 has vias 35 for electrically connecting the core conductor layer 21 and the conductor layer 32. The resin insulation layer 33 is formed of a thermosetting resin composition, and the conductor layer 34 having a plurality of the connection terminals T1 is formed on the surface of the resin insulation layer 33. The resin insulation layer 33 has vias 36 for electrically connecting the conductor layer 32 and the conductor layer 34. The resin insulation layers 31 and 33 and the conductor layer 32 form a layered structure.

Each of the vias 35 and 36 has a via hole 37a; a via conductor 37b provided on the inner circumferential surface of the via hole 37a; a via pad 37c provided so as to achieve electrical conduction with the via conductor 37b at the bottom thereof; and a via land 37d extending outwardly from an opening edge of the via conductor 37b on the side opposite the via pad 37c.

The connection terminals T1 are employed for connection to semiconductor chips. The connection terminals T1 are of a so-called peripheral type and are arranged along the inner periphery of a semiconductor chip mounting region. The semiconductor chips are electrically connected to the connection terminals T1, thereby being mounted on the wiring substrate 100. In order to improve adhesion between the connection terminals T1 and the below-described filling member 4, the surfaces of the connection terminals T1 are roughened.

Even in the case where the surfaces of the connection terminals T1 are not roughened, adhesion between the terminals T1 and the below-described filling member 4 can be improved by coating the surfaces of the connection terminals T1 with any one metal element selected from among Sn (tin), Ti (titanium), Cr (chromium), and Ni (nickel) to thereby form a metal layer, and then treating the metal layer with a coupling agent.

The coupling agent plays a role in generally improving adhesion between a metal or an inorganic material and an organic material such as a resin. The coupling agent employed may be, for example, a silane coupling agent, a titanate coupling agent, or an aluminate coupling agent, and is more preferably a silane coupling agent.

Examples of the silane coupling agent include aminosilane, epoxysilane, and styrenesilane.

As shown in FIG. 3, each connection terminal T1 has a side surface composed of a contact surface T1a which is in contact with the filling member 4, and a spaced surface T1b which is not in contact with the filling member 4 and which is located above the contact surface T1a and below the top surface of the filling member 4. The contact surface T1a and the spaced surface T1b are formed so as to extend over the entire side surface (except for surface A connected to a metal wiring 34 (wiring pattern); hereinafter the surface A may be referred to as "connection surface A") of the connection terminal T1.

Preferably, the space S provided between the spaced surface T1b of each connection terminal T1 and the filling member 4 has a depth D1 of 6 μm or less. Preferably, the space S provided between the spaced surface T1b of each connection terminal T1 and the filling member 4 has a width W of 6 μm or less. When at least one of the depth D1 and width W of the space S exceeds 6 μm, the space S may fail to be filled with a metal plating layer, solder, an underfill material, or the like. In such a case, the metal plating layer, solder, underfill material, or the like may fail to serve as an anchor for the connection terminal T1, whereby the connection terminals T1 may fail to exhibit a sufficient bonding strength.

The exposed surface of each connection terminal T1 is covered with a metal plating layer M. During mounting of semiconductor chips on the wiring substrate 100, solder applied (through coating) onto connection terminals of the semiconductor chips is reflowed, to thereby electrically connect the connection terminals of the semiconductor chips with the corresponding connection terminals T1. The metal plating layer M is formed of, for example, a single metal layer or a plurality of metal layers selected from among an Ni layer, an Sn layer, an Ag layer, a Pd layer, an Au layer, etc. (e.g., Ni layer/Au layer or Ni layer/Pd layer/Au layer).

Instead of employing the metal plating layer M, an anticorrosive OSP (organic solderability preservative) treatment may be carried out. Also, the exposed surfaces of the connection terminals T1 may be coated with solder. Alternatively, the exposed surfaces of the connection terminals T1 may be covered with the metal plating layer M, followed by coating the metal plating layer M with solder. The method of coating the exposed surfaces of the connection terminals T1 with solder will be described hereinbelow.

The filling member 4 is an insulation member stacked on the build-up layer 3, and the material of the filling member 4 is preferably the same as that of the solder resist layer 5. The filling member 4 is filled between the connection terminals T1 formed on the front surface of the build-up layer 3, and each of the connection terminals T1 has a side surface composed of the contact surface T1a which is in contact with the filling member 4, and the spaced surface T1b which is not in contact with the filling member 4 and which is located above the contact surface T1a and below the top surface of the filling member 4. The thickness D2 of the filling member 4 is smaller than the thickness (height) D3 of each connection terminal T1.

The solder resist layer 5 covers the wiring pattern connected to the connection terminals T1 and has the openings 5a through which are exposed the connection terminals T1 arranged along the inner periphery of a semiconductor chip mounting region. The openings 5a of the solder resist layer 5 are of an NSMD type such that a plurality of the connection terminals T1 are arranged within a single opening 5a.

(Configuration on back surface side) The build-up layer 13 is formed of resin insulation layers 131 and 133 and conductor layers 132 and 134 stacked on the back surface side of the core substrate 2. The resin insulation layer 131 is formed of a thermosetting resin composition, and the conductor layer 132, which serves as a metal wiring L12, is formed on the back surface of the resin insulation layer 131. The resin insulation layer 131 has vias 135 for electrically connecting the core conductor layer 22 and the conductor layer 132. The resin insulation layer 133 is formed of a thermosetting resin composition, and the conductor layer 134 having one or more connection terminals T11 is formed on the surface of the resin insulation layer 133. The resin insulation layer 133 has vias 136 for electrically connecting the conductor layer 132 and the conductor layer 134.

Each of the vias 135 and 136 has a via hole 137a; a via conductor 137b provided on the inner circumferential surface of the via hole 137a; a via pad 137c provided so as to achieve electrical conduction with the via conductor 137b at the bottom thereof; and a via land 137d extending outwardly from an opening edge of the via conductor 137b on the side opposite the via pad 137c.

The connection terminals T11 are employed as back-surface lands (PGA pads or BGA pads) for connecting the wiring substrate 100 to motherboards and the like. The connection terminals T11 are formed in an outer peripheral region (i.e., a region excluding a generally central region) of the wiring substrate 100, and are arranged in a rectangular array form so as to surround the generally central region. At least a portion of the surface of each of the connection terminals T11 is covered with the metal plating layer M.

The solder resist layer 14 is formed by stacking a solder resist film on the surface of the build-up layer 13. The solder resist layer 14 has openings 14a through which the surfaces of the connection terminals T11 are partially exposed. Thus, the connection terminals T11 are in such a state that the surfaces thereof are partially exposed from the solder resist layer 14 through the respective openings 14a. That is, the openings 14a of the solder resist layer 14 are of the SMD type such that the surfaces of the connection terminals T11 are exposed partially. Unlike the case of the openings 5a of the solder resist layer 5, the openings 14a of the solder resist layer 14 are formed for individual connection terminals T11.

Solder balls B are formed of solder which contains substantially no Pb (e.g., Sn—Ag, Sn—Cu, Sn—Ag—Cu, or Sn—Sb) in the respective openings 14a so as to be electrically connected to the respective connection terminals T11 via the metal plating layer M. During mounting of the wiring substrate 100 on motherboards and the like, the solder balls B of the wiring substrate 100 are reflowed, to thereby electrically connect the connection terminals T11 to corresponding connection terminals of the motherboards and the like.

(Wiring substrate production method) FIGS. 4 to 11 show production steps for the wiring substrate 100 according to the first embodiment. Next will be described a production method for the wiring substrate 100 with reference to FIGS. 4 to 11.

Figure 4:
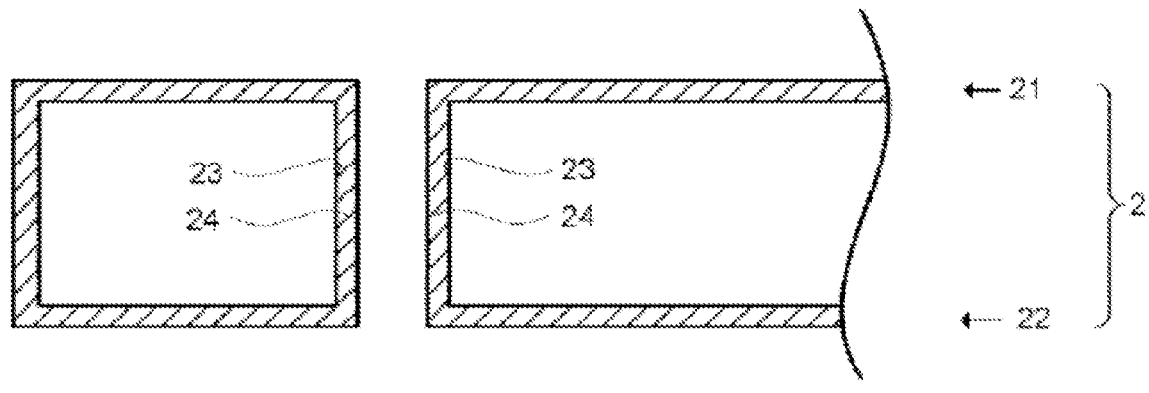
FIG. 4 shows a production process for the wiring substrate according to the first embodiment (core substrate formation process).
Figure 4:
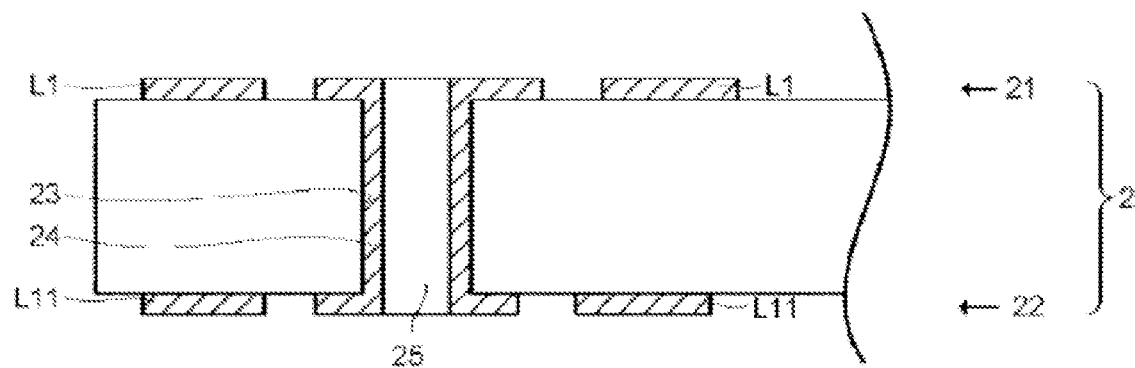

(Core substrate formation process: FIG. 4) There is provided a copper-clad laminate prepared by attaching copper foils on the front and back surfaces of a plate-like resin substrate. Through holes to become the through holes 23 are provided in the copper-clad laminate at specific positions through drilling by means of a drill. Then, the copper-clad laminate is subjected to electroless copper plating and electrolytic copper plating through a conventionally known technique, to thereby form the through hole conductors 24 on the inner walls of the through holes 23, and to form copper plating layers on the opposite surfaces of the copper-clad laminate (see FIG. 4(a)).

Thereafter, the through hole conductors 24 are filled with the resin filler material 25 (such as epoxy resin). Furthermore, copper plating layers formed on the respective copper foils on the opposite surfaces of the copper-clad laminate are etched to desired patterns so as to form the core conductor layers 21 and 22, which serves as the metal wirings L1 and L11, on the front and back surfaces of the copper-clad laminate, respectively. Thus, the core substrate 2 is produced (see FIG. 4(b)). After the process of providing the through holes 23, preferably, a desmear process is carried out for removing smears from processed portions.

Figure 5:
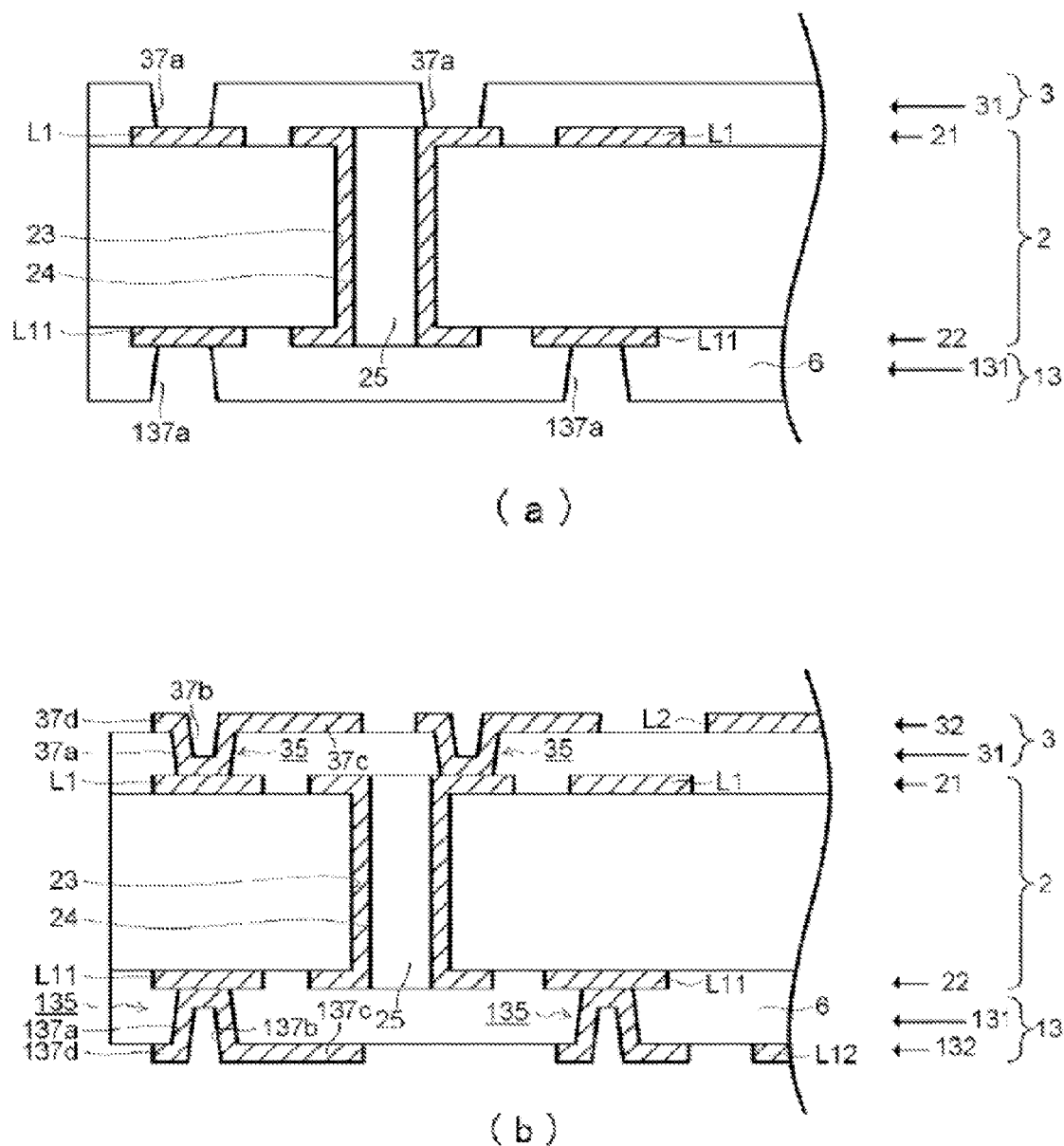
FIG. 5 shows a production process for the wiring substrate according to the first embodiment (build-up process).
Figure 6:
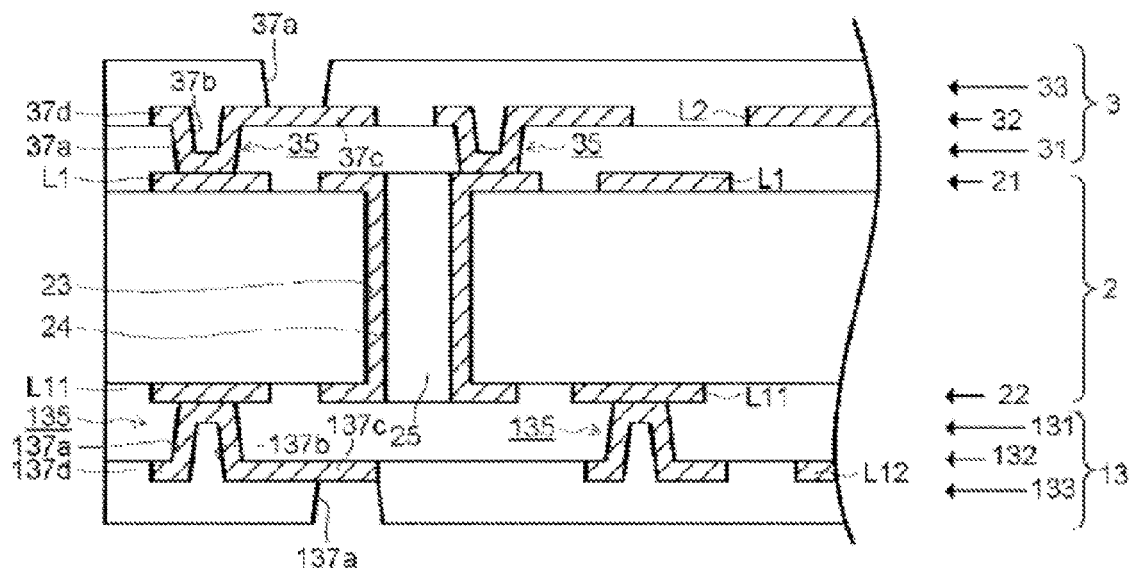
FIG. 6 shows a production process for the wiring substrate according to the first embodiment (build-up process).
Figure 6:
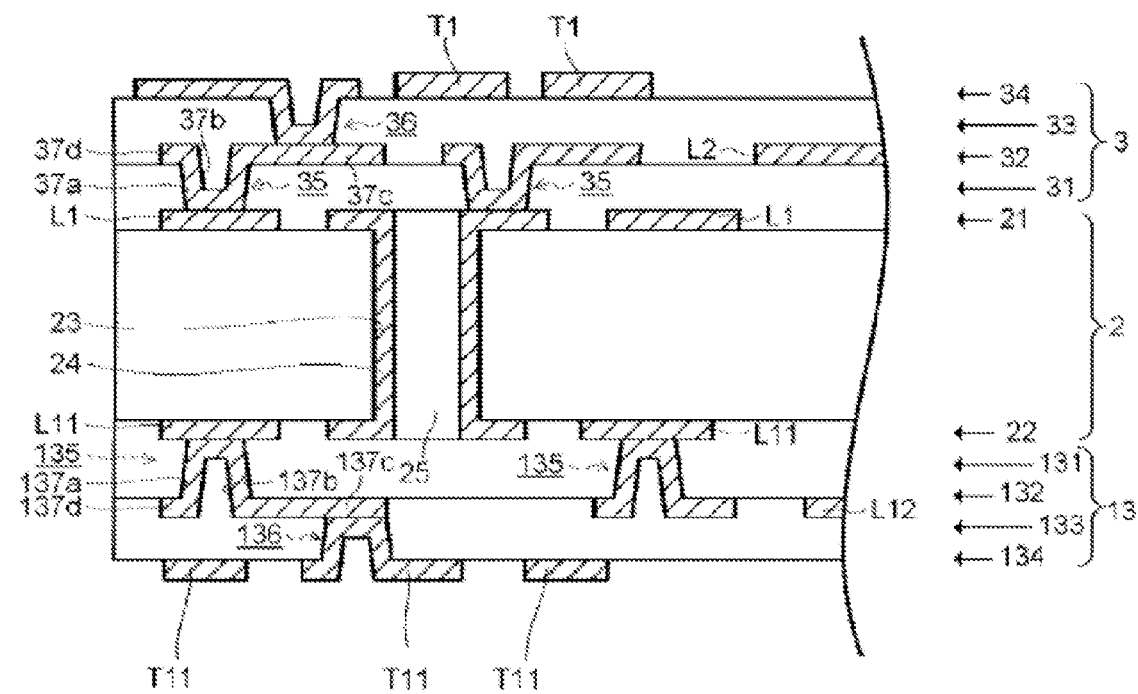

(Build-up process: FIGS. 5 and 6) Film-like insulation resin materials which contain an epoxy resin as a main component and are to become the resin insulation layers 31 and 131 are respectively applied onto the front and back surfaces of the core substrate 2. The resultant layered product is pressurized and heated by means of a vacuum thermocompression press, to thereby pressure-bond the film-like insulation resin materials to the core substrate 2 while the resin materials are thermally cured. Next, the via holes 37a and 137a are respectively provided in the resin insulation layers 31 and 131 through laser irradiation by means of a conventionally known laser machining apparatus (see FIG. 5(a)).

Subsequently, the surfaces of the resin insulation layers 31 and 131 are roughened, and then, electroless copper plating is carried out, to thereby form electroless copper plating layers on the resin insulation layers 31 and 131 and on the inner walls of the via holes 37a and 137a. Then, a photoresist is laminated on the electroless copper plating layers formed on the resin insulation layers 31 and 131, followed by light exposure and development, to thereby form plating resist films in a desired pattern.

Thereafter, with the plating resist films being employed as masks, electrolytic copper plating is carried out, to thereby form a desired copper plating pattern. Next, the plating resist films are removed, and then the electroless copper plating layers underlying the plating resist films are removed, to thereby form the conductor layers 32 and 132, which respectively serve as the metal wirings L2 and L12. During this process, the vias 35 and 135, which are respectively formed of the via conductors 37b and 137b, the via pads 37c and 137c, and the via lands 37d and 137d, are also provided (see FIG. 5(b)).

Subsequently, film-like insulation resin materials which contain an epoxy resin as a main component and are to become the resin insulation layers 33 and 133 are respectively applied onto the conductor layers 32 and 132. The resultant layered product is pressurized and heated by means of a vacuum thermocompression press, to thereby pressure-bond the film-like insulation resin materials to the conductor layers 32 and 132 while the resin materials are thermally cured. Next, the via holes 37a and 137a are respectively provided in the resin insulation layers 33 and 133 through laser irradiation by means of a conventionally known laser machining apparatus (see FIG. 6(a)).

Subsequently, in a manner similar to that employed for forming the conductor layers 32 and 132, the conductor layers 34 and 134 having the connection terminals T1 and T11, and the vias 36 and 136 are respectively formed on the resin insulation layers 33 and 133 in which the via holes 37a and 137a are provided respectively (see FIG. 6(b)).

Figure 7:
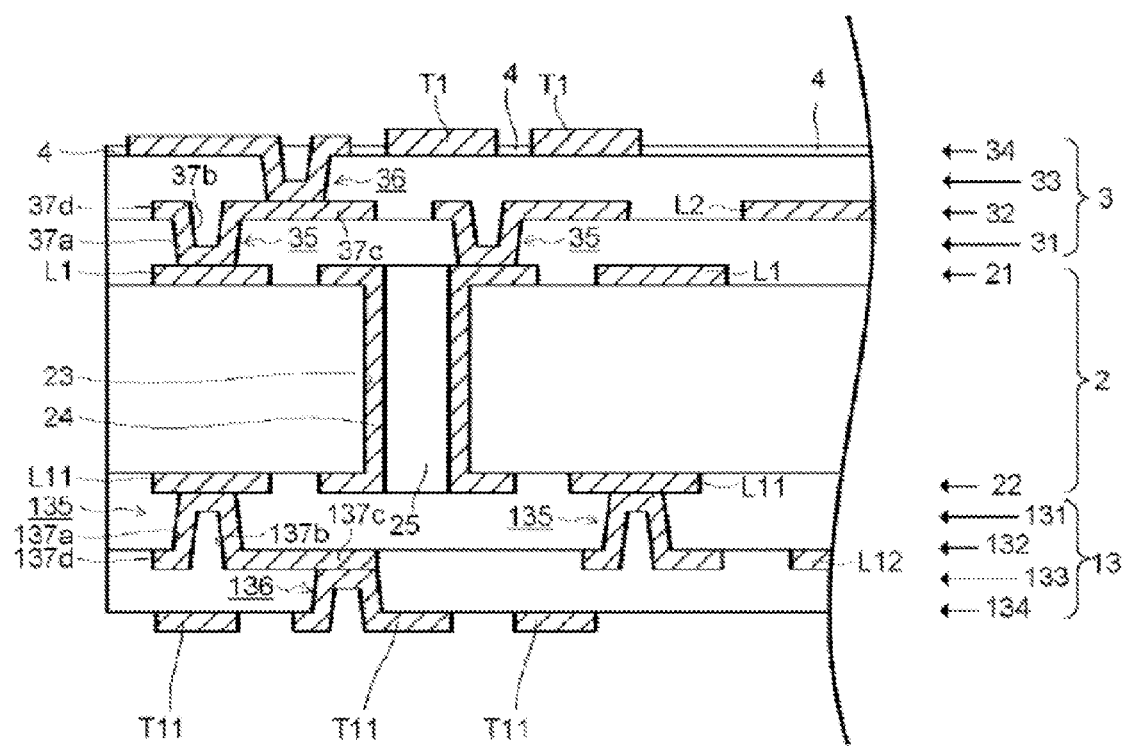
FIG. 7 shows a production process for the wiring substrate according to the first embodiment (filling process).

(Filling process: FIG. 7) Next, the filling member 4 is filled between the connection terminals T1, which form a surface layer of the build-up layer 3, such that the level of the filling member 4 is lower than that of the connection terminals T1. In order to fill with the filling member 4 between the connection terminals T1, preferably, the surfaces (particularly, side surfaces) of the connection terminals T1 are roughened. The surfaces of the connection terminals T1 can be roughened through, for example, treatment with an etchant, such as MEC ETCH BOND (a product of MEC Co. Ltd.). Instead of roughening the surfaces of the connection terminals T1, adhesion between the terminals T1 and the filling member 4 may be improved by coating the surfaces of the connection terminals T1 with any one metal element selected from among Sn (tin), Ti (titanium), Cr (chromium), and Ni (nickel) to thereby form a metal layer, and then treating the metal layer with a coupling agent.

Various methods may be employed for filling with the filling member 4 between the connection terminals T1. Next will be described methods of filling with the filling member 4 between the connection terminals T1. In the following first to fourth filling methods, an insulation resin to become the filling member 4 may be applied through various techniques, such as printing, laminating, roll coating, and spin coating.

(First filling method) In the first filling method, the front surface of the build-up layer 3 having thereon the connection terminals T1 (i.e., surface layer) is thinly coated with a thermosetting insulation resin, and then the resin is thermally cured, followed by grinding of the thus-cured insulation resin until the level thereof becomes lower than that of the connection terminals T1. Thereafter, the filling member 4 is removed at a portion corresponding to the side surfaces (except for the connection surface A to the metal wiring 34 (wiring pattern)) of each connection terminal T1, to thereby provide a space S. Thus, in each connection terminal T1, there are formed a contact surface T1$a$ which is in contact with the filling member 4, and a spaced surface T1$b$ which is not in contact with the filling member 4 and which is located above the contact surface T1$a$ and below the top surface of the filling member 4. During this removal process, attention should be paid to remove the filling member 4 to such an extent that the surface of the resin insulation layer 33, which underlies the filling member 4, is not exposed.

(Second filling method) In the second filling method, the front surface of the build-up layer 3 having thereon the connection terminals T1 (i.e., surface layer) is thinly coated with a thermosetting insulation resin, and then excess insulation resin covering the top surfaces of the connection terminals T1 is removed by means of a solvent which dissolves the insulation resin, followed by thermal curing of the remaining insulation resin. When excess insulation resin is removed by means of the solvent, a portion of the insulation resin corresponding to the side surfaces of each connection terminal T1 is further removed, to thereby provide a space S at the side surface (except for the connection surface A to the metal wiring 34 (wiring pattern)) of each connection terminal T1. Thus, there are formed, on the side surface of each connection terminal T1, a contact surface T1$a$ which is in contact with the filling member 4, and a spaced surface T1$b$ which is not in contact with the filling member 4 and which is located above the contact surface T1$a$ and below the top surface of the filling member 4. During this removal process, attention should be paid to remove the filling member 4 to such an extent that the surface of the resin insulation layer 33, which underlies the filling member 4, is not exposed.

(Third filling method) In the third filling method, the front surface of the build-up layer 3 having thereon the connection terminals T1 (i.e., surface layer) is thickly coated with a thermosetting insulation resin, and then the insulation resin is thermally cured. Subsequently, a region other than a semiconductor device mounting region is masked, and the cured insulation resin is dry-etched through, for example, RIE (reactive ion etching) until the level of the resin becomes lower than that of the connection terminals T1.

Thereafter, the filling member 4 is removed at a portion corresponding to the side surface (except for the connection surface A to the metal wiring 34 (wiring pattern)) of each connection terminal T1, to thereby provide a space S.

Thus, there are formed, in each connection terminal T1, a contact surface T1$a$ which is in contact with the filling member 4, and a spaced surface T1$b$ which is not in contact with the filling member 4 and which is located above the contact surface T1$a$ and below the top surface of the filling member 4. When the filling member 4 is filled between the connection terminals T1 through the third filling method, the filling member 4 and the solder resist layer 5 are integrally formed.

During this removal process, attention should be paid to remove the filling member 4 to such an extent that the surface of the resin insulation layer 33, which underlies the filling member 4, is not exposed.

Figure 8:
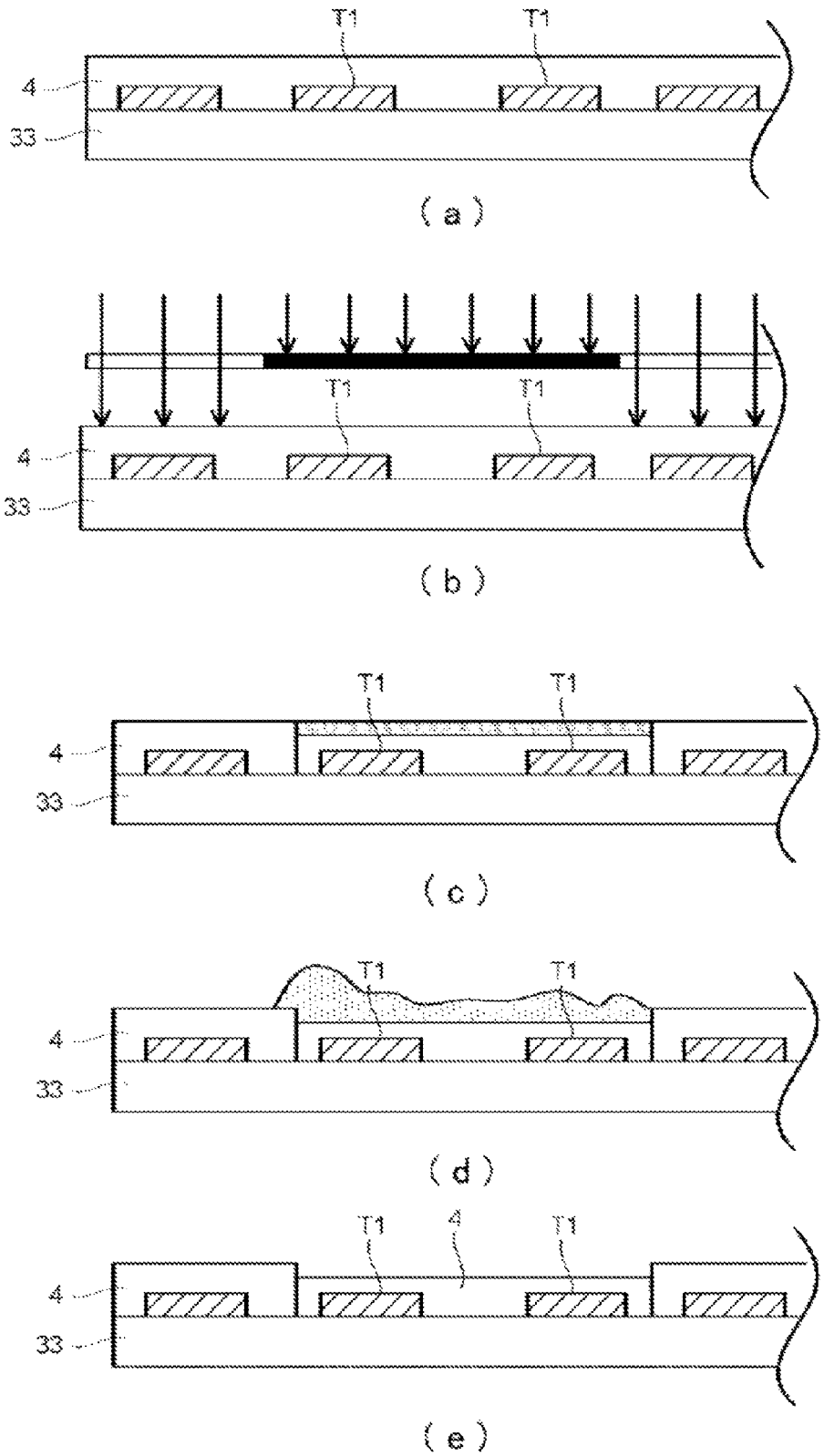
FIG. 8 illustrates a fourth filling method.

(Fourth filling method) FIG. 8 illustrates the fourth filling method. Next will be described the fourth filling method with reference to FIG. 8. In the fourth filling method, the front surface of the build-up layer 3 having thereon the connection terminal T1 (i.e., surface layer) is thickly coated with a photocurable insulation resin (see FIG. 8($a$)), and then the insulation resin is subjected to light exposure and development while regions which are to become the openings 5$a$ of the solder resist layer are masked, to thereby photo-cure the insulation resin in a region which is to become the outer region around the openings 5$a$ (see FIG. 8($b$)). Subsequently, the intermediate product of the wiring substrate 100 is immersed in an aqueous sodium carbonate solution (concentration: 1 wt. %) for a short period of time (to such an extent that the surface of the insulation resin in an unexposed region slightly swells) (see FIG. 8($c$)).

Thereafter, the thus-swollen insulation resin is emulsified through washing with water (FIG. 8($d$)). Next, the swollen and emulsified insulation resin is removed from the intermediate product of the wiring substrate 100 (see FIG. 8($e$)). The aforementioned immersion and water washing processes are carried out once or a plurality of times until the level of the insulation resin which is not photo-cured becomes lower than that of the connection terminal T1. Subsequently, the insulation resin is cured by means of heat or UV rays.

According to the fourth filling method, when excess insulation resin is removed through the aforementioned immersion and water washing processes, a portion of the insulation resin corresponding to the side surface of each connection terminal T1 is further removed, to thereby provide a space S at the side surface (except for the connection surface A to the metal wiring 34 (wiring pattern)) of each connection terminal T1. Thus, there are formed a contact surface T1$a$ which is in contact with the filling member 4, and a spaced surface T1$b$ which is not in contact with the filling member 4 and which is located above the contact surface T1$a$ and below the top surface of the filling member 4. During this removal process, attention should be paid to remove the filling member 4 to such an extent that the surface of the resin insulation layer 33, which underlies the filling member 4, is not exposed. When the filling member 4 is filled between the connection terminals T1 through the fourth filling method, the filling member 4 and the solder resist layer 5 are integrally formed.

Figure 9:
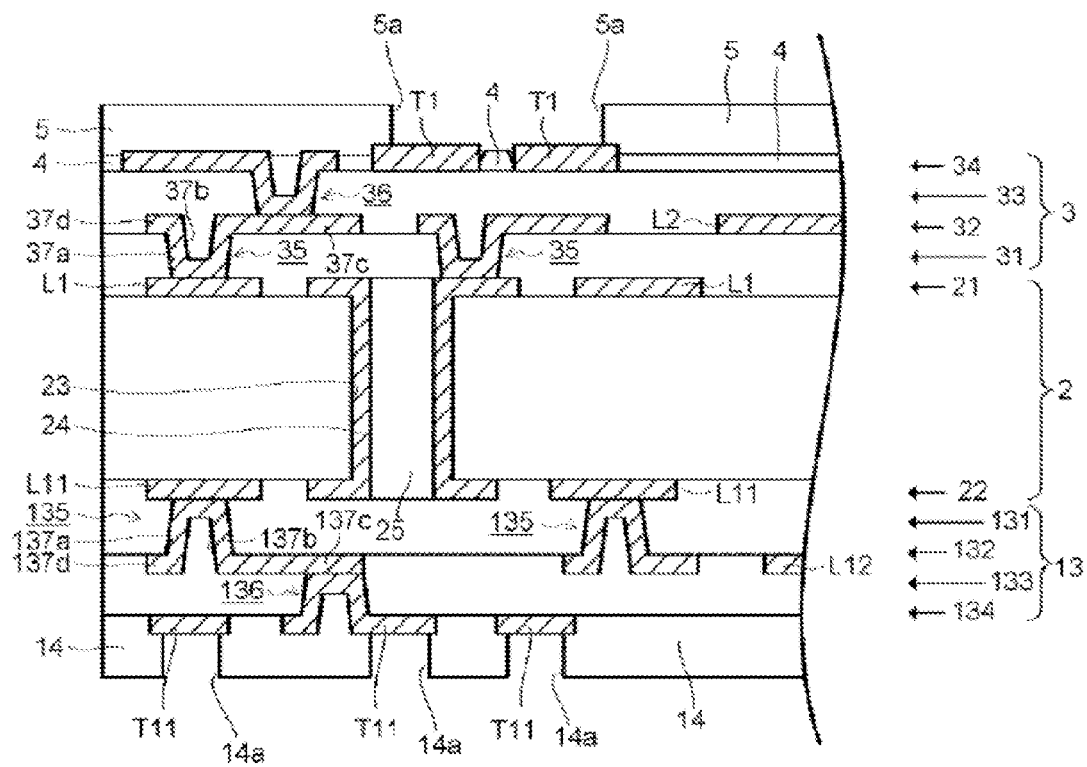
FIG. 9 shows a production process for the wiring substrate according to the first embodiment (solder resist layer process).

(Solder resist layer process: FIG. 9) Solder resist films are stacked through pressing on the surfaces of the filling member 4 and the resin insulation layer 134. The thus-stacked solder resist films are subjected to light exposure and development, to thereby form the solder resist layer 5 having the NSMD-type openings 5$a$ for exposing the front surfaces and side surfaces of the connection terminals T1, and to form the solder resist layer 14 having the SMD-type openings 14$a$ for partially exposing the front surfaces of the connection terminals T11. When the aforementioned third or fourth filling method is employed in the filling process, the filling member 4 and the solder resist layer 5 are integrally formed. Therefore, the solder resist layer formation process does not require stacking of the solder resist layer 5.

Figure 10:
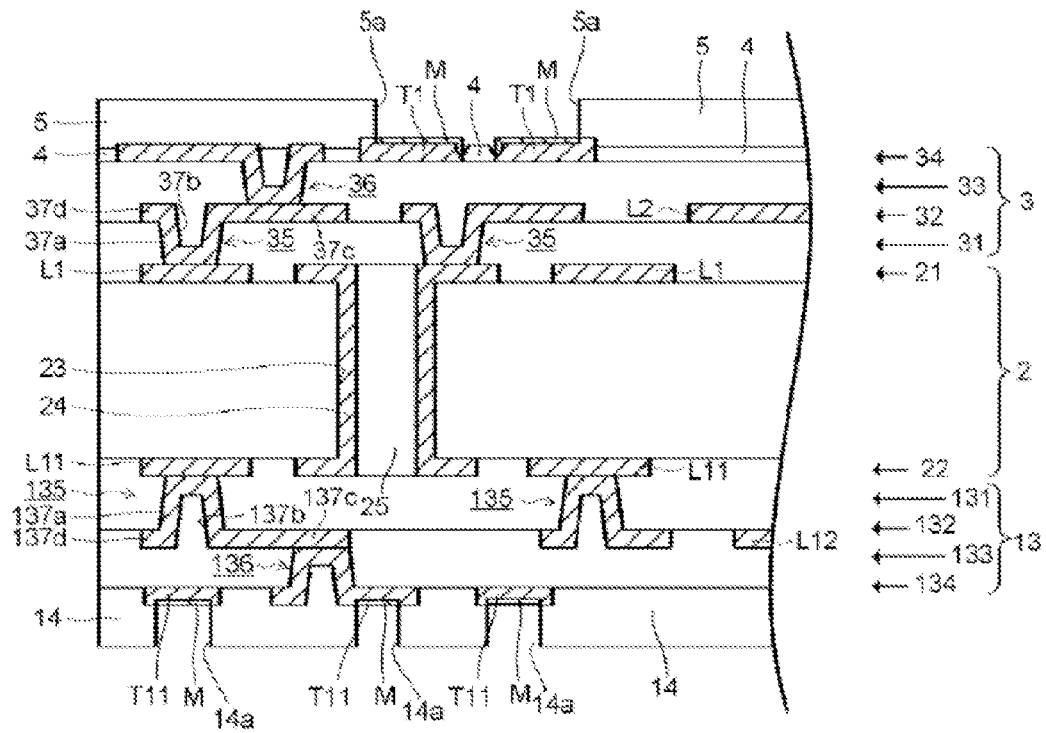
FIG. 10 shows a production process for the wiring substrate according to the first embodiment (plating process).

(Plating process: FIG. 10) Subsequently, the exposed surfaces of the connection terminals T1 are subjected to etching with, for example, sodium persulfate, to thereby remove impurities (e.g., oxide film) from the surfaces of the connection terminals T1. This etching forms a step at the periphery (outer periphery) of the main surface of each of the connection terminals T1. Thereafter, the metal plating layer M is formed on the exposed surfaces of the connection terminals T1 and T11 through electroless reduction plating by use of a reducing agent. When the metal plating layer M is formed on the exposed surfaces of the connection terminals T1 by electroless displacement plating, the metal plating layer M is formed through displacement of metal of the exposed surfaces of the connection terminals T1. Therefore, without etching of the exposed surfaces of the connection terminals T1 with sodium persulfate or the like, a step is formed at the periphery of the main surface of each connection terminal T1.

In the case where the exposed surfaces of the connection terminals T1 are coated with solder, any of the following two methods may be employed in consideration of the thickness of a solder layer formed through coating.

(First coating method) When a solder layer having a thickness of 5 to 30 μm is formed through application onto the exposed surfaces of the connection terminals T1, the exposed surfaces of the connection terminals T1 are slightly etched (soft etching) so as to remove oxide film from the exposed surfaces of the connection terminals T1. This process forms a step at the periphery of the main surface of each of the connection terminals T1. Next, a paste of mixture of Sn (tin) powder, an ionic compound containing a metal (e.g., Ag (silver) or Cu (copper)), and a flux (e.g., SUPER SOLDER (product name): product of Harima Chemicals Group, Inc.) is thinly applied to the entire inner regions of the NSMD-type openings 5*a* so as to cover the entire exposed surfaces of the connection terminals T1. Thereafter, reflowing is carried out, to thereby form a solder layer of an alloy of Sn and Ag or an alloy of Sn, Ag, and Cu on the exposed surfaces of the connection terminals T1.

(Second coating method) When a solder layer having a thickness of 10 μm or less is formed through application onto the exposed surfaces of the connection terminals T1, the exposed surfaces of the connection terminals T1 are slightly etched (soft etching) so as to remove oxide film from the exposed surfaces of the connection terminals T1. This process forms a step at the periphery of the main surface of each of the connection terminals T1. Next, electroless Sn (tin) plating is carried out on the exposed surfaces of the connection terminals T1 to form an Sn plating layer, and a flux is applied so as to cover the entire surface of the Sn plating layer. Thereafter, reflowing is carried out to melt the Sn plating layer formed on the connection terminals T1, to thereby form a solder layer on the main surfaces of the connection terminals T1. In this case, molten Sn coheres on the main surfaces of the connection terminals T1 by the effect of surface tension.

Figure 11:
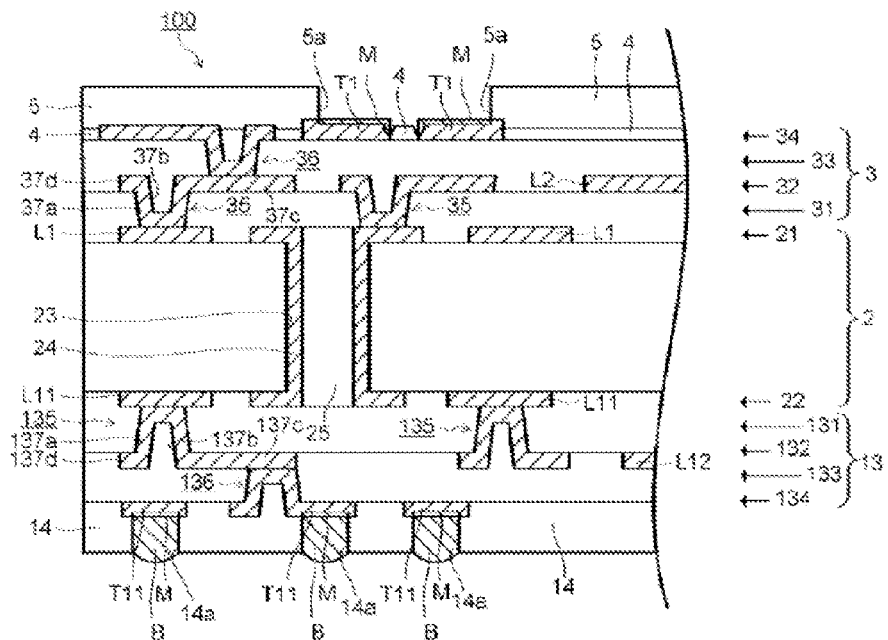
FIG. 11 shows a production process for the wiring substrate according to the first embodiment (back end process).

(Back end process: FIG. 11) A solder paste is applied, through solder printing, onto the metal plating layer M formed on the connection terminals T11, and then the applied solder paste is reflowed at a specific temperature for a specific period of time, to thereby form solder balls B on the connection terminals T11.

Figure 12:
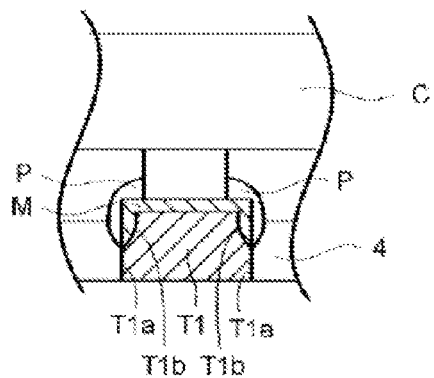
FIG. 12 is a cross-sectional view of a connection terminal onto which a semiconductor chip is connected by means of solder.

FIG. 12 is a cross-sectional view of a connection terminal T1 onto which a semiconductor chip C is connected by means of solder P. As shown in FIG. 12, since the solder P enters the space S, short circuit between the connection terminals T1, which would otherwise occur due to flow of the solder toward the adjacent connection terminals T1, can be prevented during mounting of the semiconductor chip C.

Figure 13:
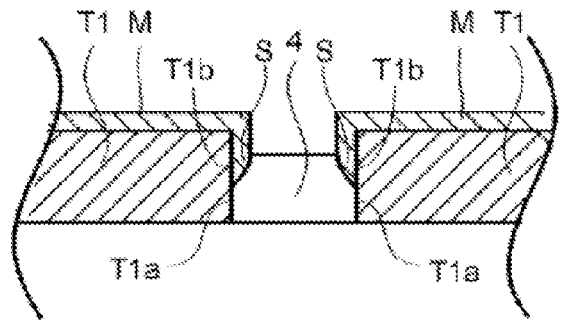
FIG. 13 is a cross-sectional view of a connection terminal on which a metal plating layer is formed.
Figure 14:
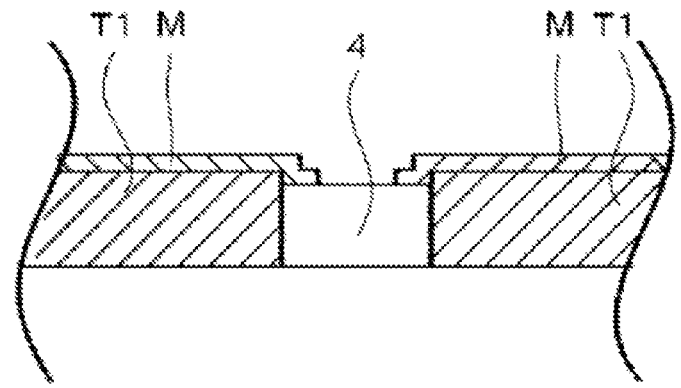
FIG. 14 shows the configuration of connection terminals on the front surface side of a comparative wiring substrate.

FIG. 13 is a cross-sectional view of another connection terminal T1 on which the metal plating layer M is formed. FIG. 13 shows the case where the metal plating layer M is formed on the connection terminal T1 through electroless reduction plating without employing electroless displacement plating or etching. In this case, since the metal plating layer M enters the space S, there can be avoided a state as shown in FIG. 14; i.e., a state where the metal plating layer M extends over the top surface of the filling member 4.

As described above, in the wiring substrate 100 according to the first embodiment, each of the connection terminals T1 formed on the front surface side has a side surface composed of the contact surface T1*a* which is in contact with the filling member 4, and the spaced surface T1*b* which is not in contact with the filling member 4 and which is located above the contact surface T1*a* and below the top surface of the filling member 4. Thus, when the connection terminals T1 are coated with solder, or when semiconductor chips are connected to the connection terminal T1 by means of solder, the solder P enters between the spaced surface T1*b* of each connection terminal T1 and the filling member 4. Therefore, short circuit between the connection terminals T1, which would otherwise occur due to flow of the solder coating the surface of each connection terminal T1 toward the adjacent connection terminal T1, can be prevented.

When the surface of each connection terminal T1 is covered with the metal plating layer M, the metal plating layer M enters the space S between the spaced surface T1*b* of the connection terminal T1 and the filling member 4. Therefore, there can be avoided a state where the metal plating layer M extends over the top surface of the filling member 4; i.e., a state where the distance between the metal plating layers formed on the surfaces of the adjacent connection terminals T1 is reduced. Thus, there can be prevented short circuit between the connection terminals T1 during coating of the connection terminals T1 with solder or during mounting of a semiconductor chip on the connection terminals T1, which short circuit would otherwise occur due to flow of the solder from each connection terminal T1 toward the adjacent connection terminal T1.

Also, the aforementioned metal plating layer M or solder, or an underfill material employed for mounting of a semiconductor chip enters the space S. Since the thus-entered metal plating layer M, solder, or underfill material serves as an anchor for the connection terminal T1, sufficient bonding strength can be attained. Therefore, removal of the connection terminal T1 can be prevented during the course of production of the wiring substrate.

The contact surface T1*a* and the spaced surface T1*b* are formed so as to extend over the entire side surface (except for the connection surface A to the wiring pattern) of each connection terminal T1. Therefore, short circuit between adjacent connection terminals T1, which would otherwise occur due to solder flowing, etc., can be prevented at all the side surfaces of each connection terminal T1.

In the case where the connection terminals T1 are subjected to soft etching, or the metal plating layer M is formed through displacement plating, a step is formed at the outer periphery of the first main surface of each connection terminal T1, which is opposite the surface thereof that is in contact with the resin insulation layer 33 forming the build-up layer 3. Therefore, the diameter of the solder layer coating the connection terminal T1 does not increase, and the pitch between adjacent connection terminals T1 can be further reduced.

Also, since the filling member 4 is filled between the connection terminals T1 after roughening of the surface of each connection terminal T1 which is in contact with the filling member 4, the bonding strength between the connection terminals T1 and the filling member 4 is enhanced. Thus, there can be prevented accidental removal of the connection terminals T1 during the course of production of the wiring substrate. When the filling member 4 is formed of the same material as that of the solder resist layer 5, the filling member 4 exhibits solder flowability similar to that of the solder resist layer 5. Thus, there can be prevent short circuit between the connection terminals T1, which would otherwise occur due to remaining of the solder on the filling member 4.

Furthermore, the thickness D2 of the filling member 4 filled between the connection terminals T1 is adjusted to be smaller than the thickness (height) D3 of the connection terminals T1. That is, the connection terminals T1 slightly project from the top surface of the filling member 4. Thus, even when the center of a connection terminal of a semiconductor chip deviate from the center of each connection terminal T1, the connection terminal of the semiconductor chip come into contact with the end of the corresponding connection terminal T1. Therefore, there is improved the reliability of connection between the connection terminals T1 and the connection terminals of the semiconductor chips.

Second Embodiment

Figure 15:
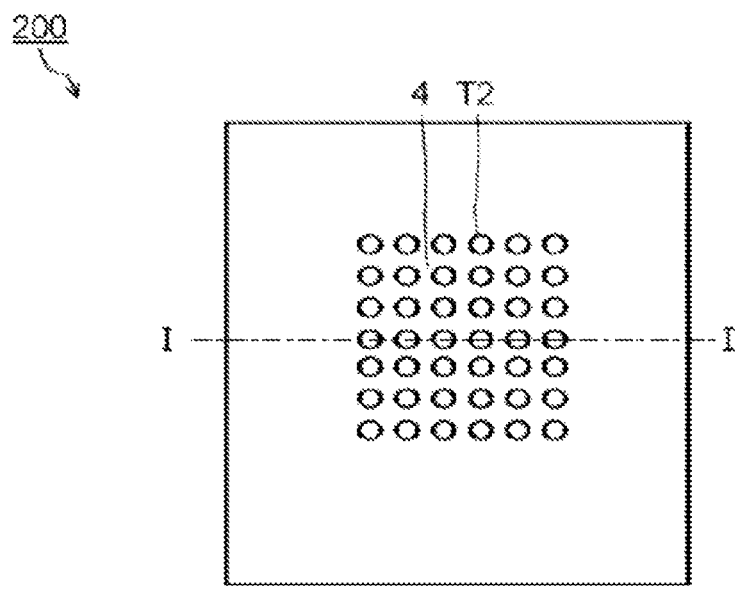
FIG. 15 is a plan view (on the front surface side) of a wiring substrate according to a second embodiment.
Figure 16:
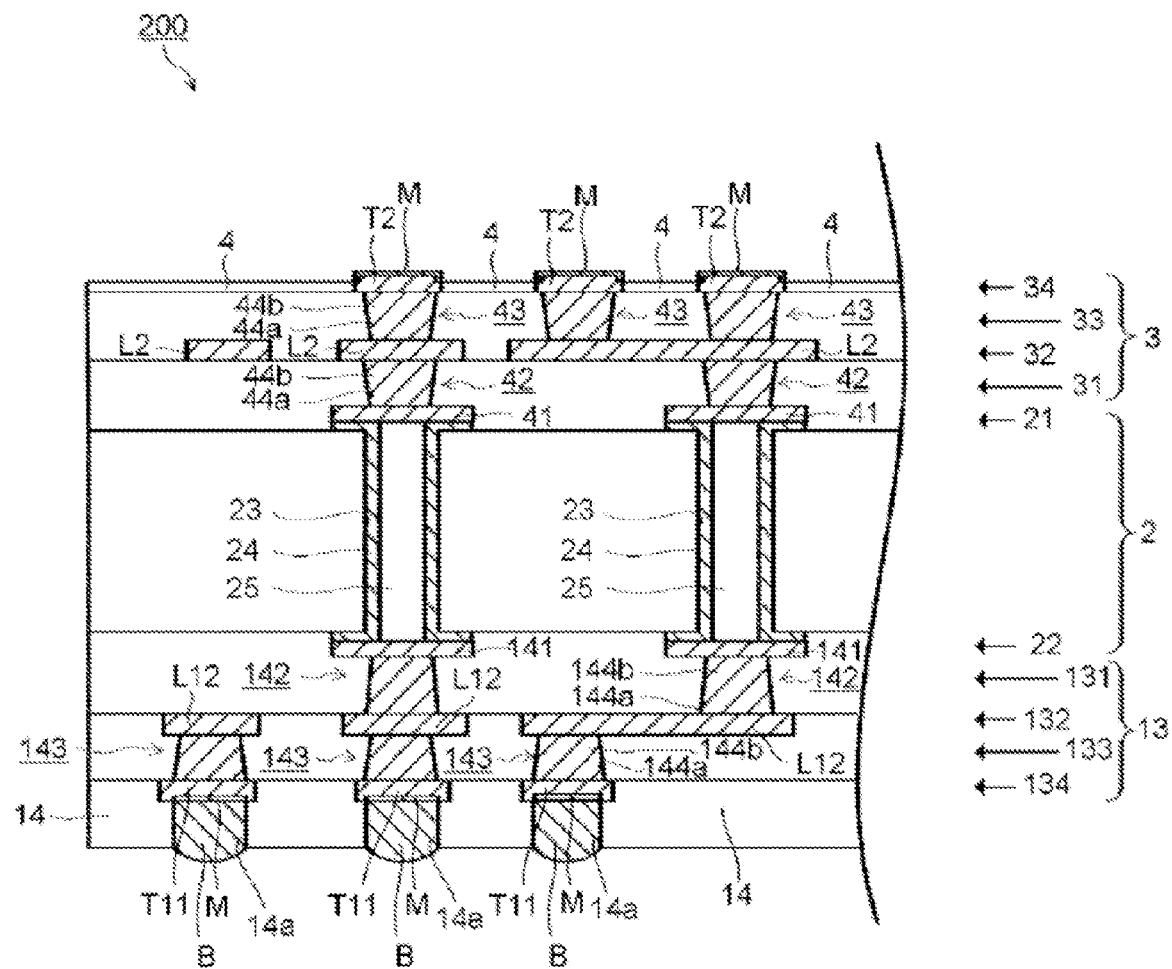
FIG. 16 is a partially cross-sectional view of the wiring substrate according to the second embodiment.
Figure 17:
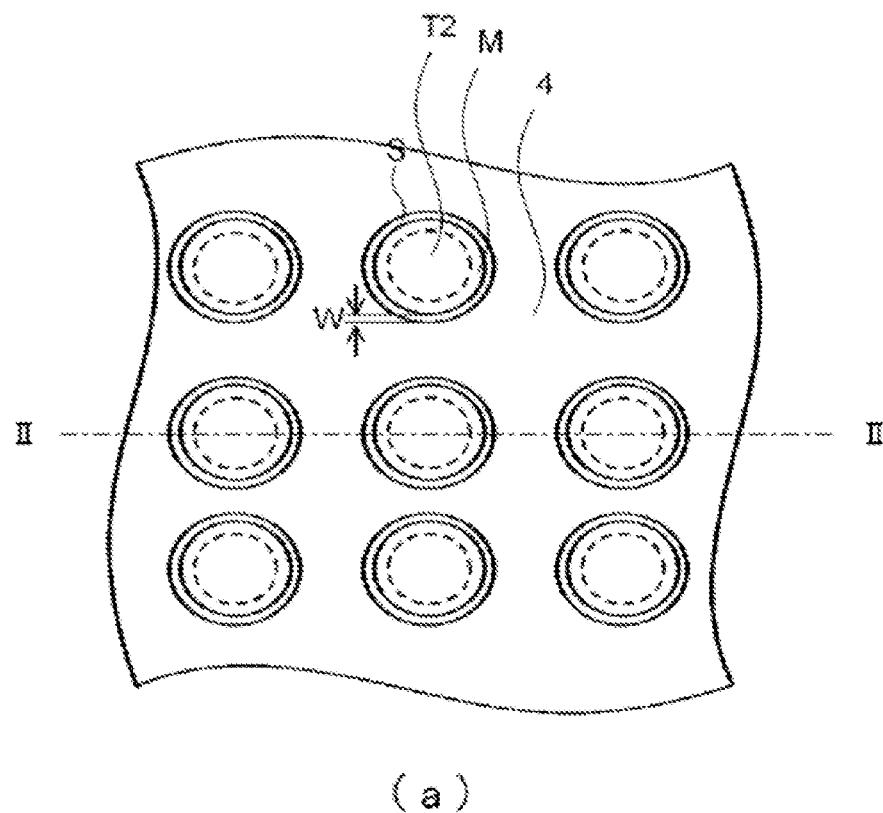
FIG. 17 shows the configuration of connection terminals on the front surface side of the wiring substrate according to the second embodiment.
Figure 17:
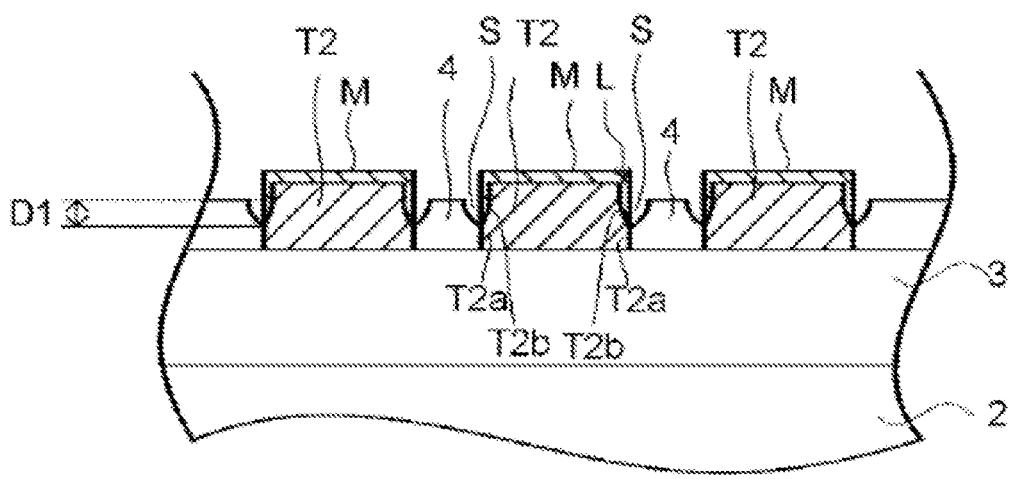

FIG. 15 is a plan view (on the front surface side) of a wiring substrate 200 according to the second embodiment. FIG. 16 is a partially cross-sectional view of the wiring substrate 200 taken along line I-I of FIG. 15. FIG. 17 shows the configuration of connection terminals T2 formed on the front surface side of the wiring substrate 200. FIG. 17(a) is a top view of the connection terminals T2. FIG. 17(b) is a cross-sectional view taken along line II-II of FIG. 17(a). Although the configuration of the wiring substrate 200 will next be described with reference to FIGS. 15 to 17, the same components as employed in the wiring substrate 100 (which has been described with reference to FIGS. 1 to 3) are denoted by the same reference numerals, and repeated description thereof is omitted.

(Configuration on front surface side) On the front surface side of the wiring substrate 200, a cover plating layer 41 electrically connected to a core conductor layer 21 is formed, and the cover plating layer 41 and a conductor layer 32 are electrically connected by means of filled vias 42, whereas the conductor layer 32 and a conductor layer 34 are electrically connected by means of filled vias 43. Each of the filled vias 42 and 43 has a via hole 44a and a via conductor 44b, which fills the via hole 44a through plating. Also, only connection terminals T2, which will be described below, are formed on the front surface of the build-up layer 3 such that there are not formed a wiring pattern connected at the same layer to the connection terminals T2, and a solder resist layer which covers the wiring pattern. Resin insulation layers 31 and 33 and the conductor layer 32 form a layered structure.

The connection terminals T2 formed on the front surface side of the wiring substrate 200 are of a so-called area bump type, and are arranged over the entire semiconductor chip mounting region. The connection terminals T2 are connected to the semiconductor chips. The semiconductor chips are electrically connected to the connection terminals T2, thereby being mounted on the wiring substrate 200. In order to improve adhesion between the connection terminals T2 and the filling member 4, the surfaces of the connection terminals T2 are roughened. The surfaces of the connection terminals T2 can be roughened through, for example, treatment with an etchant, such as MEC ETCH BOND (a product of MEC Co. Ltd.).

As shown in FIG. 17, each connection terminal T2 has a side surface composed of a contact surface T2a which is in contact with the filling member 4, and a spaced surface T2b which is not in contact with the filling member 4 and which is located above the contact surface T2a and below the top surface of the filling member 4. The contact surface T2a and the spaced surface T2b are formed so as to extend over the entire side surface of the connection terminal T2.

Preferably, the space S provided between the spaced surface T2b of each connection terminal T2 and the filling member 4 has a depth D1 of 6 μm or less. Preferably, the space S provided between the spaced surface T2b of each connection terminal T2 and the filling member 4 has a width W of 6 μm or less. When at least one of the depth D1 and width W of the space S exceeds 6 μm, the space S may fail to be filled with a metal plating layer, solder, an underfill material, or the like. In such a case, the metal plating layer, solder, underfill material, or the like may fail to serve as an anchor for the connection terminals T2, whereby the connection terminals T2 may fail to exhibit a sufficient bonding strength.

The exposed surface of each connection terminal T2 is covered with a metal plating layer M. During mounting of semiconductor chips on the wiring substrate 200, solder applied (through coating) onto connection terminals of each semiconductor chip is reflowed, to thereby electrically connect the connection terminals of the semiconductor chip with the corresponding connection terminals T2. Instead of employing the metal plating layer M, coating with solder may be carried out, or an anticorrosive OSP treatment may be carried out.

The metal plating layer M is formed on the connection terminals T2 in the following manner. Specifically, the exposed surfaces of the connection terminals T2 are subjected to etching with, for example, sodium persulfate, and then the metal plating layer M is formed on the exposed surfaces of the connection terminals T2 through electroless reduction plating by use of a reducing agent. This etching process employing sodium persulfate or the like forms a step at the periphery of the main surface of each of the connection terminals T2. When the metal plating layer M is formed on the exposed surfaces of the connection terminals T2 through electroless displacement plating, the metal plating layer M is formed through displacement of metal of the exposed surfaces of the connection terminals T2. Therefore, even without etching of the exposed surfaces of the connection terminals T2 with sodium persulfate or the like, a step is formed at the periphery of the main surface of each of the connection terminals T2.

A plurality of the connection terminals T2 of the wiring substrate 200 project from the resin insulation layer 33, whereby the front surfaces and side surfaces of the connection terminals T2 are exposed. Thus, similar to the case of the connection terminals T1 of the wiring substrate 100, the filling member 4 (i.e., insulation member) is filled between the connection terminals T2. Specifically, the filling member 4 is provided between the connection terminals T2 each having a side surface composed of the contact surface T2a which is in contact with the filling member 4, and the spaced surface T2b which is not in contact with the filling member 4 and which is located above the contact surface T2a and below the top surface of the filling member 4. The thickness of the filling member 4 is smaller than the thickness (height) of each connection terminal T2. The filling member 4 can be filled between the connection terminals T2 through any of the first to fourth filling methods described above in the section of the first embodiment.

(Configuration on back surface side) On the back surface side of the wiring substrate 200, a cover plating layer 141 electrically connected to the core conductor layer 22 is formed, and the cover plating layer 141 and the conductor layer 132 are electrically connected by means of filled vias 142, whereas the conductor layer 132 and the conductor layer 134 are electrically connected by means of filled vias 143. Each of the filled vias 142 and 143 has a via hole 144a and a via conductor 144b, which fills the via hole 144a through plating.

As described above, in the wiring substrate 200 according to the second embodiment, each connection terminal T2 formed on the front surface side has a side surface composed of the contact surface T2a which is in contact with the filling member 4, and the spaced surface T2b which is not in contact with the filling member 4 and which is located above the contact surface T2a and below the top surface of the filling member 4. The wiring substrate 200 exhibits the same effects as those obtained by the wiring substrate 100 according to the first embodiment.

Third Embodiment

Figure 18:
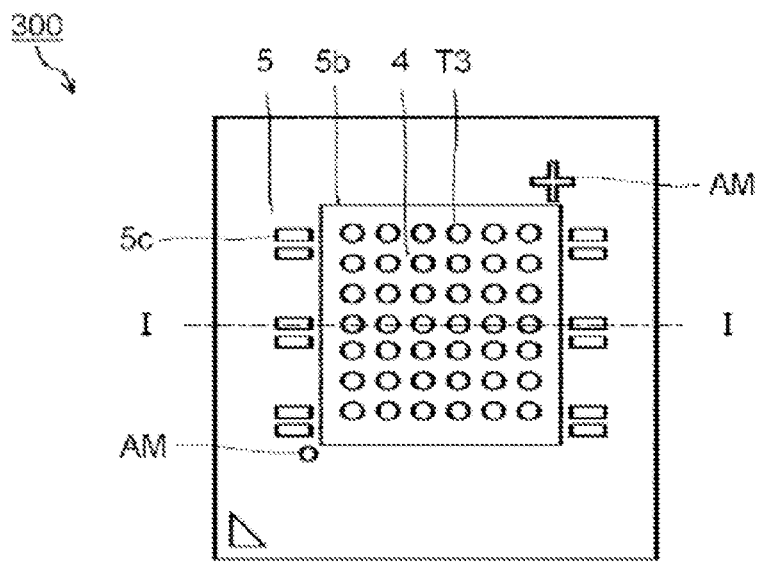
FIG. 18 is a plan view (on the front surface side) of a wiring substrate according to a third embodiment.
Figure 19:
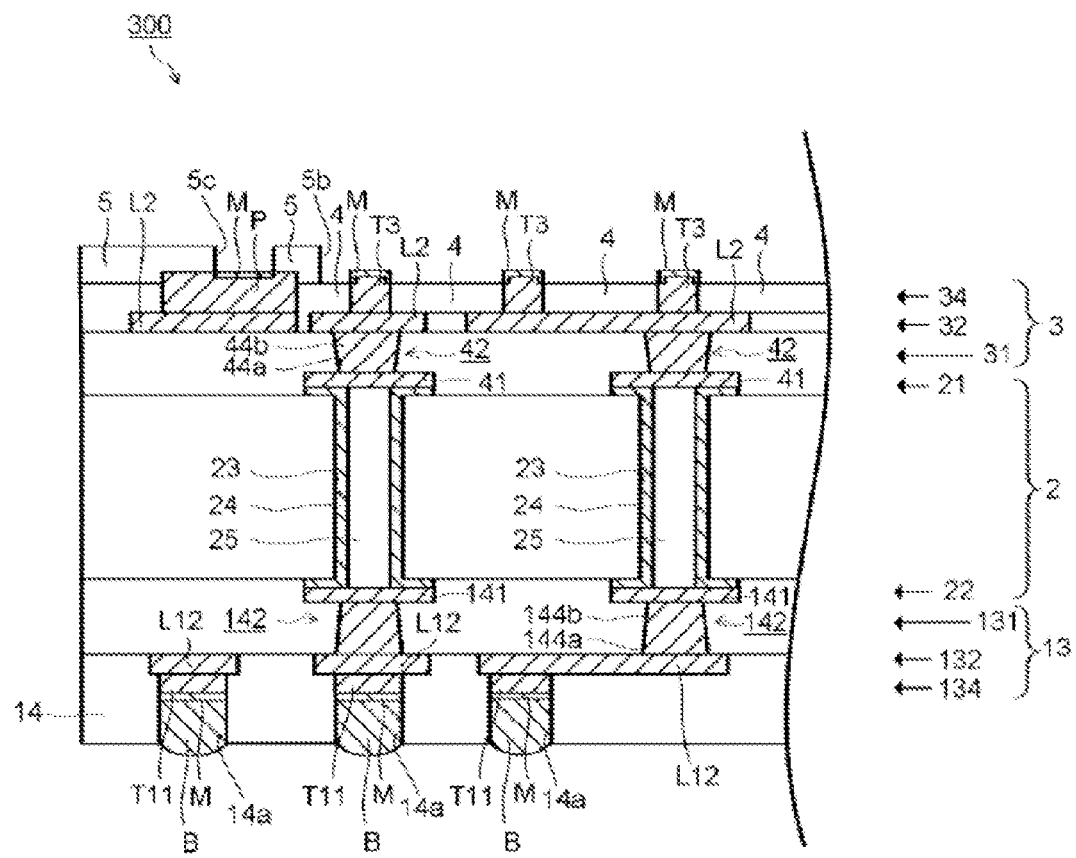
FIG. 19 is a partially cross-sectional view of the wiring substrate according to the third embodiment.
Figure 20:
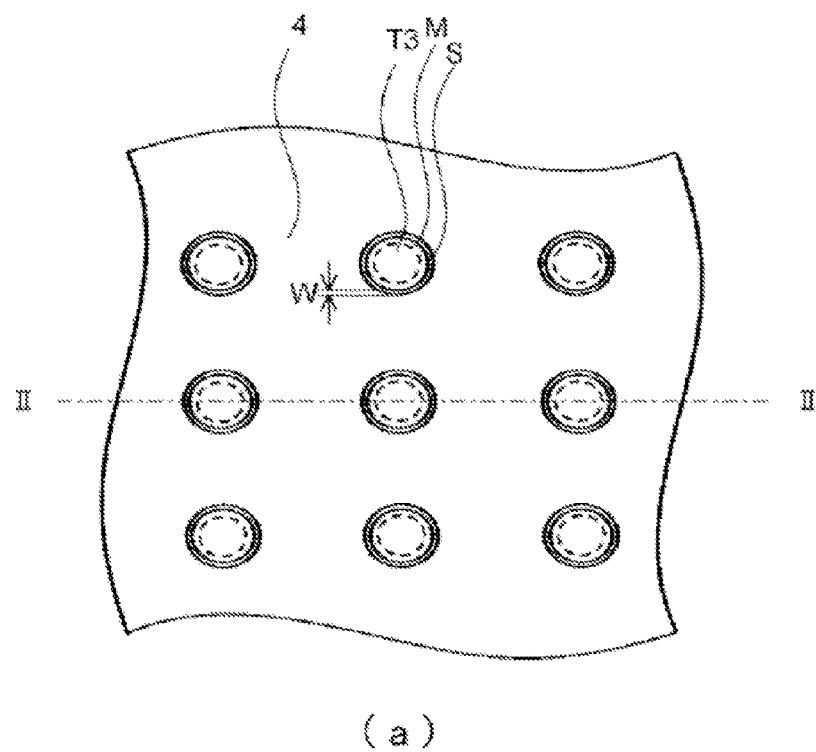
FIG. 20 shows the configuration of connection terminals on the front surface side of the wiring substrate according to the third embodiment.
Figure 20:
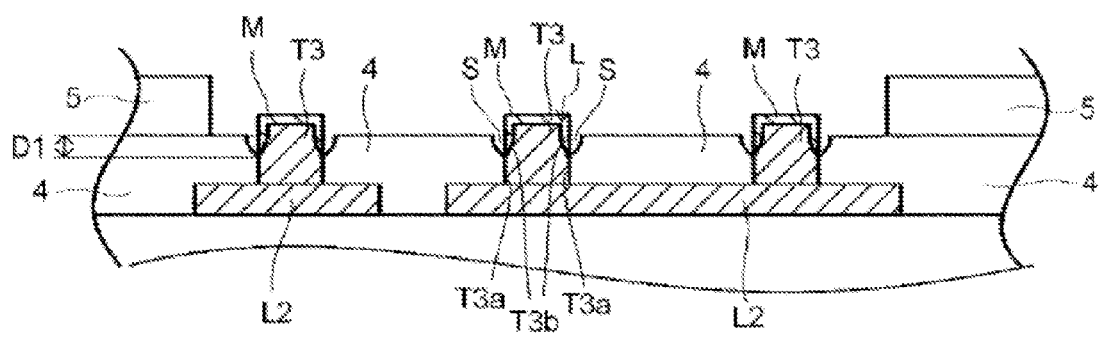

FIG. 18 is a plan view (on the front surface side) of a wiring substrate 300 according to the third embodiment. FIG. 19 is a partially cross-sectional view of the wiring substrate 300 taken along line I-I of FIG. 18. FIG. 20 shows the configuration of connection terminals T3 formed on the front surface side of the wiring substrate 300. FIG. 20(a) is a top view of the connection terminals T3. FIG. 20(b) is a cross-sectional view taken along line II-II of FIG. 20(a).

The wiring substrate 300 according to the third embodiment differs from the wiring substrate 200 described above with reference to FIGS. 15 to 17 in that connection terminals T3 and T11 are formed directly on conductor layers 32 and 132, respectively, without the intervention of vias. Although the configuration of the wiring substrate 300 will next be described with reference to FIGS. 18 to 20, components common between the wiring substrate 300 and the wiring substrate 100 (which has been described with reference to FIGS. 1 to 3) or the wiring substrate 200 (which has been described with reference to FIGS. 15 to 17) are denoted by the same reference numerals, and repeated description thereof is omitted.

(Configuration on front surface side) On the front surface side of the wiring substrate 300, a cover plating layer 41 electrically connected to a core conductor layer 21 is formed, and the cover plating layer 41 and a conductor layer 32 are electrically connected by means of filled vias 42. Each filled via 42 has a via hole 44a and a via conductor 44b, which fills the via hole 44a through plating. The connection terminals T3 formed on the conductor layer 32 of the wiring substrate 300 are arranged at generally even intervals in a lattice array over the entire semiconductor chip mounting region. The connection terminals T3 have a columnar shape (e.g., circular column, square column, or triangular column) and are formed directly on the conductor layer 32 without the intervention of vias such that their upper portions project from the front surface of the filling member 4. The connection terminals T3 are connected to the semiconductor chips.

The semiconductor chips are electrically connected to the connection terminals T3, thereby being mounted on the wiring substrate 300. In order to improve adhesion between the connection terminals T3 and the filling member 4, the surfaces of the connection terminals T3 are roughened. The surfaces of the connection terminals T3 can be roughened through, for example, treatment with an etchant, such as MEC ETCH BOND (a product of MEC Co. Ltd.).

Instead of roughening the surfaces of the connection terminals T3, adhesion between the terminals T3 and the filling member 4 may be improved by coating the surfaces of the connection terminals T3 with any one metal element selected from among Sn (tin), Ti (titanium), Cr (chromium), and Ni (nickel) to thereby form a metal layer, and then treating the metal layer with a coupling agent.

As shown in FIG. 20, each connection terminal T3 has a side surface composed of a contact surface T3a which is in contact with the filling member 4, and a spaced surface T3b which is not in contact with the filling member 4 and which is located above the contact surface T3a and below the top surface of the filling member 4. The contact surface T3a and the spaced surface T3b are formed so as to extend over the entire side surface of the connection terminal T3.

Preferably, the space S provided between the spaced surface T3b of the connection terminal T3 and the filling member 4 has a depth D1 of 6 μm or less. Preferably, the space S provided between the spaced surface T3b of the connection terminal T3 and the filling member 4 has a width W of 6 μm or less. When at least one of the depth D1 and width W of the space S exceeds 6 μm, the space S may fail to be filled with a metal plating layer, solder, an underfill material, or the like. In such a case, the metal plating layer, solder, underfill material, or the like may fail to serve as an anchor for the connection terminal T3, whereby the connection terminal T3 may fail to exhibit a sufficient bonding strength.

The exposed surface of each connection terminal T3 is covered with a metal plating layer M. During mounting of semiconductor chips on the wiring substrate 300, solder applied (through coating) onto connection terminals of the semiconductor chips is reflowed, to thereby electrically connect the connection terminals of the semiconductor chips with the corresponding connection terminals T3. The metal plating layer M is formed of, for example, a single metal layer or a plurality of metal layers selected from among an Ni layer, an Sn layer, an Ag layer, a Pd layer, an Au layer, etc. (e.g., Ni layer/Au layer or Ni layer/Pd layer/Au layer).

Instead of employing the metal plating layer M, an anticorrosive OSP (organic solderability preservative) treatment may be carried out. Also, the exposed surfaces of the connection terminals T3 may be coated with solder. Alternatively, the exposed surfaces of the connection terminals T3 may be covered with the metal plating layer M, followed by coating the metal plating layer M with solder. Since a method of coating the exposed surfaces of the connection terminals T3 with solder has been described in the section of the first embodiment, repeated description thereof is omitted.

The filling member 4 is filled between the connection terminals T3 formed on the front surface of the build-up layer 3, and each of the connection terminals T3 has a side surface composed of the contact surface T3a which is in contact with the filling member 4, and the spaced surface T3b which is not in contact with the filling member 4 and which is located above the contact surface T3a and below the top surface of the filling member 4. The thickness of the filling member 4 is smaller than the thickness (height) of each connection terminal T3. The filling member 4 can be filled between the connection terminals T3 through any of the first to fourth filling methods described above in the section of the first embodiment.

The solder resist layer 5 covers the front surface of a wiring pattern connected to the connection terminals T3, and has openings 5b through which are exposed the connection terminals T3 arranged at generally even intervals in a semiconductor chip mounting region, and openings 5c through which chip capacitor mounting pads P are exposed respectively. The openings 5b of the solder resist layer 5 are of an NSMD type such that a plurality of the connection terminals T3 are arranged within a single opening. Also, alignment marks AM are formed on the solder resist layer 5.

(Configuration on Back Surface Side)

On the back surface side of the wiring substrate 300, a cover plating layer 141 electrically connected to a core conductor layer 22 is formed, and the cover plating layer 141 and a conductor layer 132 are electrically connected by means of filled vias 142. Each of the filled vias 142 has a via hole 144a and a via conductor 144b, which fills the via hole 144a through plating. Also, connection terminals T11 to be connected to motherboards and the like (not illustrated) are formed directly on the conductor layer 132 without the intervention of vias.

Figure 21:
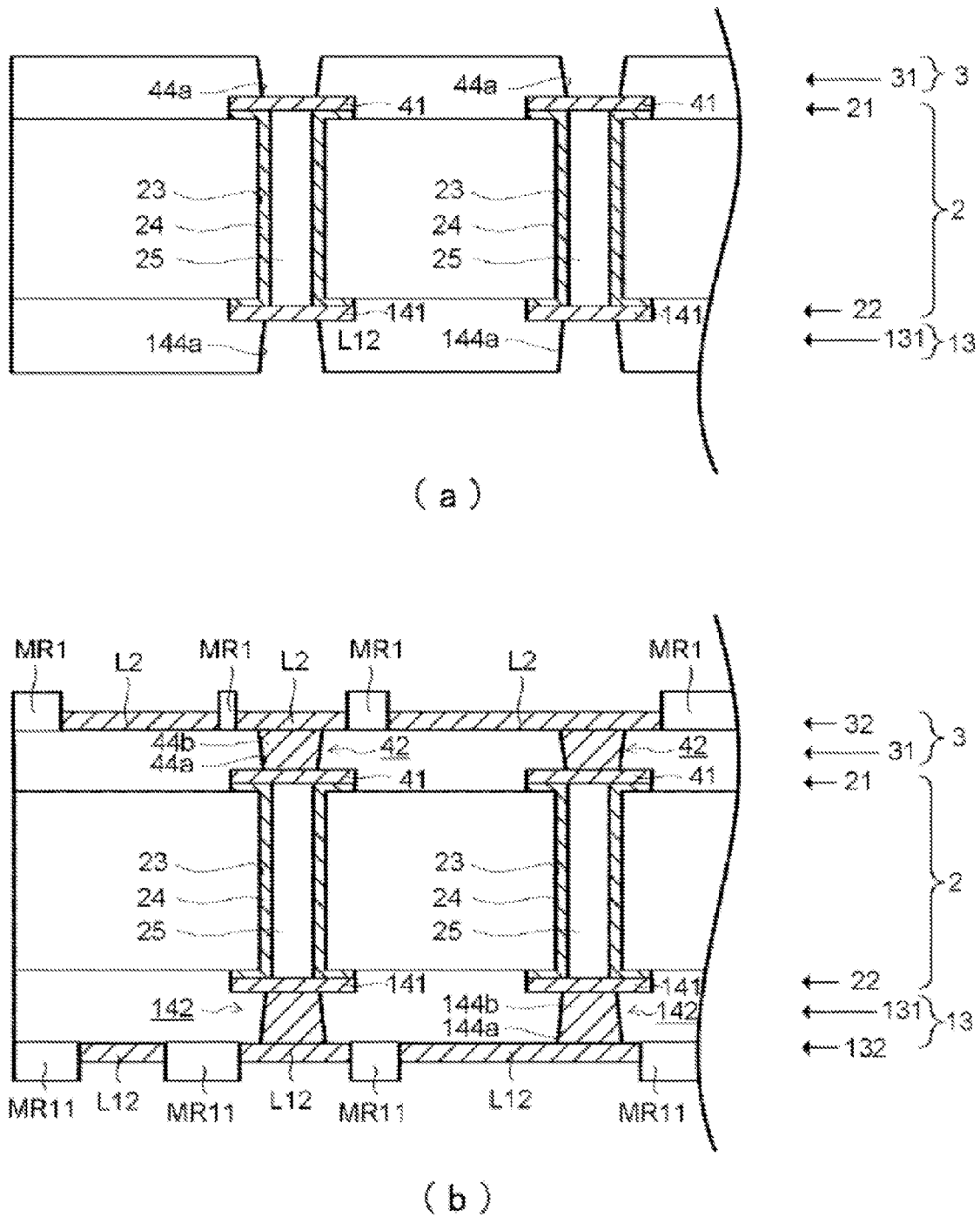
FIG. 21 shows a production process for the wiring substrate according to the third embodiment (build-up process).
Figure 22:
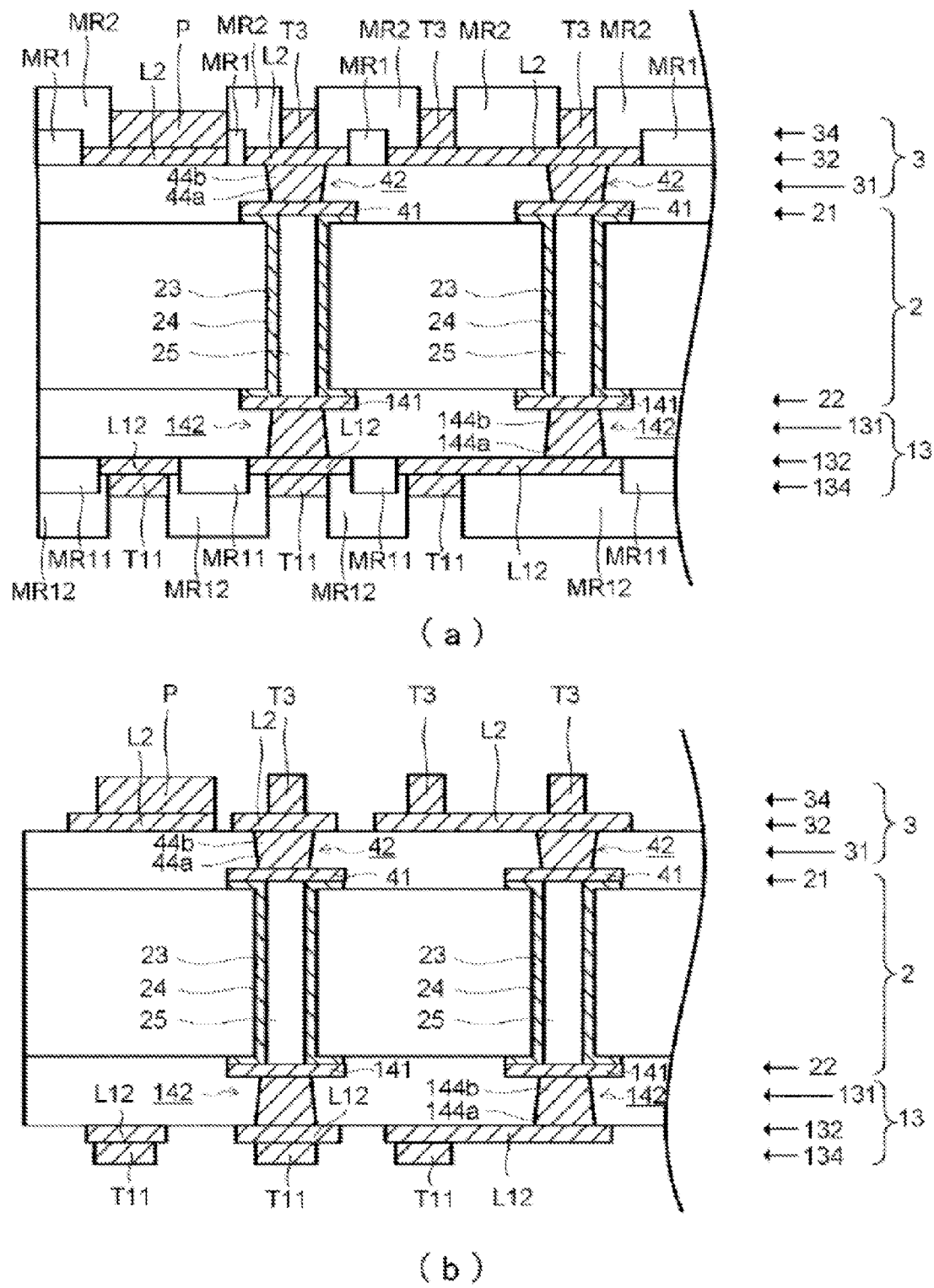
FIG. 22 shows a production process for the wiring substrate according to the third embodiment (convex plating layer formation process).

(Wiring substrate production method) FIGS. 21 and 22 show production steps of the wiring substrate 300 according to the third embodiment. Next will be described a production method for the wiring substrate 300 with reference to FIGS. 21 and 22. The core substrate formation process, the filling process, the solder resist layer process, the plating process, and the back end process are the same as those of the production method for the wiring substrate 100 according to the first embodiment described above with reference to FIGS. 4 and 7 to 11, and thus repeated description thereof is omitted.

(Build-up process: FIG. 21) Film-like insulation resin materials which contain an epoxy resin as a main component and which are to become resin insulation layers 31 and 131 are respectively applied onto the front and back surfaces of a core substrate 2. The resultant layered product is pressurized and heated by means of a vacuum thermocompression press, to thereby pressure-bond the film-like insulation resin materials to the core substrate 2 while the resin materials are thermally cured. Next, via holes 44a and 144a are respectively provided in the resin insulation layers 31 and 131 through laser irradiation by means of a conventionally known laser machining apparatus (see FIG. 21(a)).

Subsequently, after roughening of the surfaces of the resin insulation layers 31 and 131, electroless copper plating is carried out, to thereby form electroless copper plating layers on the resin insulation layers 31 and 131 and on the inner walls of the via holes 44a and 144a. Then, a photoresist is laminated on the electroless copper plating layers formed on the resin insulation layers 31 and 131, followed by light exposure and development, to thereby form plating resist films MR1 and MR11 in desired patterns. Thereafter, with the plating resist films MR1 and MR11 being employed as masks, electrolytic copper plating is carried out, to thereby form a desired copper plating pattern (see FIG. 21(b)).

(Convex plating layer formation process: FIG. 22) Next, while the plating resist films MR1 and MR11 are left intact, a photoresist is laminated on the electroless copper plating layers formed on the resin insulation layers 31 and 131, followed by light exposure and development, to thereby form plating resist films MR2 and MR12 in desired patterns. Thereafter, with the plating resist films MR2 and MR12 being employed as masks, electrolytic copper plating is carried out, to thereby form desired copper plating patterns (see FIG. 22(a)).

Subsequently, the plating resist films MR1, MR2, MR11, and MR12 are removed, and then the electroless copper plating layers underlying the plating resist films MR1 and MR2 are removed, to thereby form a conductor layer 34 having the connection terminals T3 and pads P on the conductor layer 32, and to form a conductive layer 134 having the connection terminals T11 on the conductor layer 132 (see FIG. 22(b)).

As described above, the wiring substrate 300 according to the third embodiment is configured such that the connection terminals T3 and T11 are formed directly on the conductor layers 32 and 132, respectively, without the intervention of vias. Thus, the number of production steps of the wiring substrate 300 can be reduced, whereby production cost can be reduced. Also, since the columnar connection terminals T3 project from the front surface of the filling member 4, the connection terminals T3 can be arranged at high packing density within a semiconductor chip mounting region. Other effects obtained by the wiring substrate 300 are similar to those obtained by the wiring substrate 100 according to the first embodiment and the wiring substrate 200 according to the second embodiment.

Other Embodiments

Figure 23:
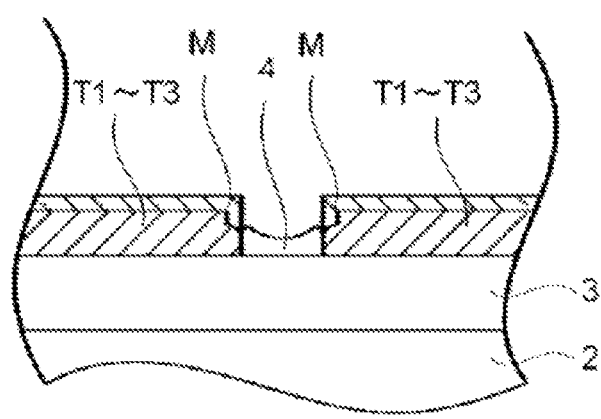
FIG. 23 shows the shape of the top surface of a filling member of a wiring substrate according to another embodiment.

In the wiring substrate 100 described above with reference to FIGS. 1 to 3, the wiring substrate 200 described above with reference to FIGS. 15 to 17, and the wiring substrate 300 described above with reference to FIGS. 18 to 20, the filling member 4 filled between the connection terminals T1 to T3 has a flat top surface. However, the top surface of the filling member 4 is not necessarily flat, and may have, for example, a roundish shape (so-called fillet shape) as shown in FIG. 23.

While the present invention has been described in detail with reference to the specific embodiments, the invention is not limited thereto. That is, various modifications and changes may be made without departing from the scope of the present invention. For example, in the above-described embodiments, the wiring substrates 100 to 300 are in the form of a BGA substrate which is to be connected to motherboards and the like with the intervention of the solder balls B. However, the wiring substrates 100 to 300 may be provided with pins or lands, in place of the solder balls B, for connection to a motherboard, etc., to thereby assume the form of a so-called PGA (pin grid array) or LGA (land grid array) substrate.

Also, in the above-described embodiments, when the first filling method or the second filling method is employed, the solder resist layer 5 is formed after formation of the filling member 4. However, formation of the solder resist layer 5 may be followed by formation of the filling member 4.

DESCRIPTION OF REFERENCE NUMERALS 100 to 300: wiring substrate
2: core substrate
3: build-up layer
4: filling member
5: solder resist layer
5a: opening
13: build-up layer
14: solder resist layer
14a: opening 21, 22: core conductor layer
23: through hole
24: through hole conductor
25: resin filler material
31, 33: resin insulation layer
32, 34: conductor layer
35, 36: via
37a: via hole
37b: via conductor
37c: via pad
37d: via land
41: cover plating layer
42, 43: filled via
44a: via hole
44b: via conductor
131, 133: resin insulation layer
132, 134: conductor layer
135, 136: via
137a: via hole
137b: via conductor
137c: via pad
137d: via land
141: cover plating layer
142, 143: filled via
144a: via hole
144b: via conductor
A: connection surface
B: solder ball
L1, L2: metal wiring
L11, L12: metal wiring
M: metal plating layer
T1 to T3, T1a to T3a: contact surface
T1b to T3b: spaced surface
T11: connection terminal
AM: alignment mark
P: pad
MR1, MR2, MR11, MR12: plating resist film
S: space

What is claimed is:

1. A wiring substrate comprising a layered structure including one or more insulation layers and one or more conductor layers, the wiring substrate being characterized in that
a plurality of connection terminals are formed on the layered structure so as to be separated from one another;
a filling member is filled between the connection terminals;
the filling member has a thickness smaller than that of the connection terminals;
each of the connection terminals has an upper surface and a side surface, the side surface composed of a contact surface which is in contact with the filling member and a spaced surface which is not in contact with the filling member and which is located above the contact surface and below a top surface of the filling member such that a space is defined between the spaced surface and the filling member with the space having a depth of 4 μm or less; and
a metal plating layer is formed on the upper surface and the spaced surface of each of the connection terminals and enters the space defined between the spaced surface and the filling member;
wherein the layered structure has thereon a solder resist layer having an opening through which the plurality of connection terminals are exposed, the solder resist layer covering a wiring pattern connected to the connection terminals, and wherein the solder resist layer and the filling member are integrally formed.

2. A wiring substrate according to claim 1, wherein the contact surface and the spaced surface are formed so as to extend over the entire side surface of each of the connection terminals.

3. A wiring substrate according to claim 1, wherein the contact surface and the spaced surface are formed so as to extend over the entire side surface of each of the connection terminals, except for a portion of the side surface connected to a wiring pattern.

4. A wiring substrate according to claim 1, wherein the space provided between the spaced surface and the filling member has a width of 6 μm or less.

5. A wiring substrate according to claim 1, wherein the filling member serves as a solder resist.

6. A wiring substrate comprising a layered structure including one or more insulation layers and one or more conductor layers, the wiring substrate being characterized in that
a plurality of connection terminals are formed on the layered structure so as to be separated from one another;
a filling member is filled between the connection terminals;
the filling member has a thickness smaller than that of the connection terminals;
each of the connection terminals has an upper surface and a side surface, the side surface composed of a contact surface which is in contact with the filling member and a spaced surface which is not in contact with the filling member and which is located above the contact surface and below a top surface of the filling member such that a space is defined between the spaced surface and the filling member with the space having a depth of 4 μm or less; and
an organic solderability preservative coating is formed on the upper surface and the spaced surface of each of the connection terminals and enters the space defined between the spaced surface and the filling member;
wherein the layered structure has thereon a solder resist layer having an opening through which the plurality of connection terminals are exposed, the solder resist layer covering a wiring pattern connected to the connection terminals, and wherein the solder resist layer and the filling member are integrally formed.

7. A wiring substrate according to claim 6, wherein the contact surface and the spaced surface are formed so as to extend over the entire side surface of each of the connection terminals.

8. A wiring substrate according to claim 6, wherein the contact surface and the spaced surface are formed so as to extend over the entire side surface of each of the connection terminals, except for a portion of the side surface connected to a wiring pattern.

9. A wiring substrate according to claim 6, wherein the space provided between the spaced surface and the filling member has a width of 6 μm or less.

10. A wiring substrate according to claim 6, wherein the filling member serves as a solder resist.

11. A wiring substrate comprising a layered structure including one or more insulation layers and one or more conductor layers, the wiring substrate being characterized in that
a plurality of connection terminals are formed on the layered structure so as to be separated from one another;

a filling member is filled between the connection terminals;

the filling member has a thickness smaller than that of the connection terminals;

each of the connection terminals has an upper surface and a side surface, the side surface composed of a contact surface which is in contact with the filling member and a spaced surface which is not in contact with the filling member and which is located above the contact surface and below a top surface of the filling member such that a space is defined between the spaced surface and the filling member with the space having a depth of 4 μm or less; and a solder coating is formed on the upper surface and the spaced surface of each of the connection terminals and enters the space defined between the spaced surface and the filling member;

wherein the layered structure has thereon a solder resist layer having an opening through which the plurality of connection terminals are exposed, the solder resist layer covering a wiring pattern connected to the connection terminals, and wherein the solder resist layer and the filling member are integrally formed.

12. A wiring substrate according to claim 11, wherein the contact surface and the spaced surface are formed so as to extend over the entire side surface of each of the connection terminals.

13. A wiring substrate according to claim 11, wherein the contact surface and the spaced surface are formed so as to extend over the entire side surface of each of the connection terminals, except for a portion of the side surface connected to a wiring pattern.

14. A wiring substrate according to claim 11, wherein the space provided between the spaced surface and the filling member has a width of 6 μm or less.

15. A wiring substrate according to claim 11, wherein the filling member serves as a solder resist.

* * * * *